(12) United States Patent
Harada et al.

(10) Patent No.: US 12,519,032 B2
(45) Date of Patent: Jan. 6, 2026

(54) POWER MODULE

(71) Applicant: SUMITOMO BAKELITE CO., LTD., Tokyo (JP)

(72) Inventors: Takahiro Harada, Tokyo (JP); Wataru Kosaka, Tokyo (JP); Shinya Yamamoto, Tokyo (JP); Atsunori Nishikawa, Tokyo (JP); Masaharu Ito, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 428 days.

(21) Appl. No.: 18/016,122

(22) PCT Filed: Jul. 2, 2021

(86) PCT No.: PCT/JP2021/025107
§ 371 (c)(1),
(2) Date: Jan. 13, 2023

(87) PCT Pub. No.: WO2022/019089
PCT Pub. Date: Jan. 27, 2022

(65) Prior Publication Data
US 2023/0298962 A1    Sep. 21, 2023

(30) Foreign Application Priority Data
Jul. 21, 2020 (JP) .................................. 2020-124566
Jan. 26, 2021 (JP) .................................. 2021-010158

(51) Int. Cl.
*H01L 23/373* (2006.01)
*H01L 23/04* (2006.01)
(Continued)

(52) U.S. Cl.
CPC .......... *H01L 23/3735* (2013.01); *H01L 23/04* (2013.01); *H01L 23/367* (2013.01);
(Continued)

(58) Field of Classification Search
CPC ... H01L 23/3735; H01L 23/04; H01L 23/367; H01L 23/5328; H01L 25/072;
(Continued)

(56) References Cited

U.S. PATENT DOCUMENTS 11,302,665 B2   4/2022   Otsuka et al.
11,848,295 B2   12/2023  Otsuka et al.
(Continued)

FOREIGN PATENT DOCUMENTS

| JP | 2010-10504 A | 1/2010 |
|----|--------------|--------|
| JP | 2012-28421 A | 2/2012 |

(Continued)

OTHER PUBLICATIONS

International Search Report, issued in PCT/JP2021/025107, PCT/ISA/210, dated Sep. 14, 2021.
(Continued)

*Primary Examiner* — Jonathan Han
(74) *Attorney, Agent, or Firm* — Birch, Stewart, Kolasch & Birch, LLP

(57) ABSTRACT

A power module (10) includes a power semiconductor chip (1) and a Cu circuit (3) having the power semiconductor chip (1) provided on one surface. The power module (10) includes: a sintering layer (2) joining the power semiconductor chip (1) and the Cu circuit (3) by using a sintering paste; and a heat dissipation sheet (4) provided for joining a Cu base plate (5) to the other surface of the Cu circuit (3), in which in a first laminated structure in which the power semiconductor chip (1), the sintering layer (2), the Cu circuit (3), and the heat dissipation sheet (4) are laminated, the total thermal resistance XA in the direction of lamination is equal to or less than 0.30 (K/W).

15 Claims, 7 Drawing Sheets

(51) Int. Cl.
*H01L 23/367* (2006.01)
*H01L 23/532* (2006.01)
*H01L 25/07* (2006.01)
*H05K 1/09* (2006.01)

(52) U.S. Cl.
CPC ........ *H01L 23/5328* (2013.01); *H01L 25/072* (2013.01); *H05K 1/09* (2013.01)

(58) Field of Classification Search
CPC ........... H01L 23/49531; H01L 23/3677; H01L 23/4334; H01L 23/295; H01L 23/3121; H01L 23/49811; H01L 25/18; H05K 1/09
See application file for complete search history.

(56) References Cited

U.S. PATENT DOCUMENTS

| | | | |
|---|---|---|---|
| 2009/0321924 | A1 | 12/2009 | Funakoshi et al. |
| 2015/0115452 | A1* | 4/2015 | Yoon ........................ H01L 24/29 228/256 |
| 2018/0240728 | A1 | 8/2018 | Konno |
| 2018/0350710 | A1 | 12/2018 | Iwahashi et al. |
| 2019/0287896 | A1* | 9/2019 | Suzuki .................... H01L 24/33 |
| 2020/0075529 | A1 | 3/2020 | Otsuka et al. |
| 2022/0189904 | A1 | 6/2022 | Otsuka et al. |
| 2024/0063164 | A1 | 2/2024 | Otsuka et al. |

FOREIGN PATENT DOCUMENTS

| | | |
|---|---|---|
| JP | 2014-3095 A | 1/2014 |
| JP | 2018-82113 A | 5/2018 |
| JP | 2019-62122 A | 4/2019 |
| JP | 2020-27878 A | 2/2020 |
| WO | WO2017/138402 A1 | 8/2017 |
| WO | WO 2018/056205 A1 | 3/2018 |
| WO | WO2018/207856 A1 | 11/2018 |

OTHER PUBLICATIONS

Written Opinion of the International Searching Authority, issued in PCT/JP2021/025107, PCT/ISA/237, dated Sep. 14, 2021.

* cited by examiner (a)

PROTRUDING POLE × 60
D = 2.4mm
H = 7.8mm (b)

4 mm PITCH (a) EXAMPLE (b) COMPARATIVE EXAMPLE

POWER MODULE

TECHNICAL FIELD

The present invention relates to a power module and relates to, for example, a power module that has a power semiconductor element and a metal circuit board (heat transfer metal layer) having the power semiconductor element provided on one surface thereof.

BACKGROUND ART

The market for power modules in which a power semiconductor element is provided on a metal circuit board for heat transfer is expanding. With regard to such power modules, various technologies have been proposed in order to realize high heat dissipation properties. For example, there is known a laminate sheet for a circuit board integrated with a finned heat sink having: a finned heat sink and a base material that are integrally molded and include a highly thermally conductive filler and a crystalline polymer; an insulating layer that is formed on the base material and includes a thermally conductive filler having insulation properties and a crystalline polymer; and a metal layer formed on the insulating layer, in which the content percentage of the highly thermally conductive filler in the finned heat sink and the base material is 15 vol % to 65 vol %, and the content percentage of the thermally conductive filler in the insulating layer is 15 vol % to 65 vol % (see, for example, Patent Document 1).

RELATED DOCUMENT

Patent Document

[Patent Document 1] Japanese Unexamined Patent Publication No. 2012-28421

SUMMARY OF THE INVENTION

Technical Problem

However, conventional power module structures have a laminated structure of "chip (power semiconductor element)/solder/Direct Bonded Copper (DBC) substrate/solder/heat dissipation fin". Solder has been used for joining of a chip (power semiconductor element) and a DBC substrate, and joining of a DBC substrate and a heat dissipation fin. When a power module is operated, the chip (power semiconductor element) generates heat; however, in the above-described structure, heat dissipation is not sufficiently achieved, and there has been a demand for countermeasure technologies.

The present invention was made in view of such circumstances, and an object of the invention is to improve the heat dissipation performance of a power module including a power semiconductor element.

Solution to Problem

According to the present invention, there is provided a power module including:

a power semiconductor element; and
a first heat dissipation structure having the power semiconductor element provided on one surface side,
in which the first heat dissipation structure includes
a first metal circuit board,
a first joining layer provided for joining the power semiconductor element to one surface of the first metal circuit board by using a sintering paste, and
a first heat dissipation sheet provided for joining a first heat dissipation member to the other surface of the first metal circuit board, and
in a laminated structure A in which the power semiconductor element, the first joining layer, the first metal circuit board, and the first heat dissipation sheet are laminated, a total thermal resistance in a direction of lamination is equal to or less than 0.30 (K/W).

Advantageous Effects of Invention

According to the present invention, a technology for improving the heat dissipation performance in a power module including a power semiconductor element can be provided.

DESCRIPTION OF EMBODIMENTS

Figure 1:
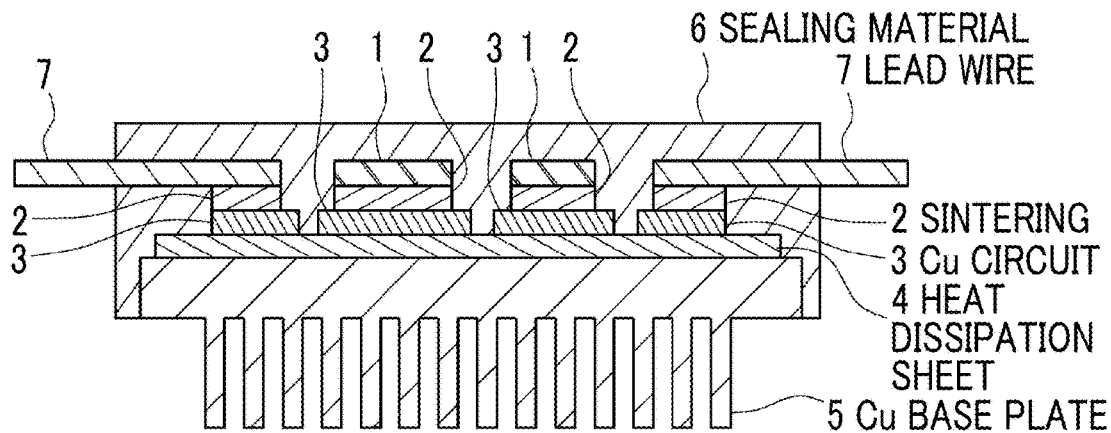
FIG. 1 is a cross-sectional view schematically showing a power module of a first embodiment.

Hereinafter, embodiments of the present invention will be described in detail with reference to the drawings. The drawings are for illustrative purposes only. The shape, dimensional ratio, and the like of each member in the drawings do not necessarily correspond to those of an actual article.

First Embodiment

Overview of Invention

<Power Module 10>

A power module 10 according to the present embodiment will be described. FIG. 1 is a cross-sectional view schematically showing the power module 10 according to the embodiment of the present invention. In the following description, in order to simplify the explanation, the positional relations (up-down relation and the like) of each constituent element of the power module 10 may be described as the relations shown in each drawing. However, the positional relations in this description are irrelevant to the positional relations at the time of use or at the time of production of the power module 10.

The power module 10 has a power semiconductor chip (also referred to as a power semiconductor element) 1, a sintering layer 2 (also referred to as "first joining layer"), a Cu circuit 3 (also referred to as "first metal circuit board"), a heat dissipation sheet 4, a Cu base plate 5 (also referred to as "first heat dissipation member"), a lead frame 6, and a sealing material 7.

<Power Semiconductor Chip 1>

The power semiconductor chip 1 is, for example, an Insulated Gate Bipolar Transistor (IGBT), or a diode. An electrode pattern, which is not shown in the diagram, is formed on an upper surface of the power semiconductor chip 1, and a conductive pattern, which is not shown in the diagram, is formed on a lower surface of the power semiconductor chip 1.

The lower surface of the power semiconductor chip 1 is joined to one surface of the Cu circuit 3, with the sintering layer 2 as a joining layer interposed therebetween. The electrode pattern on the upper surface of the power semiconductor chip 1 is electrically connected to the lead frame 6.

<Sintering Layer 2>

The sintering layer 2 is a joining layer formed by sintering a sintering paste containing metal particles. Regarding the sintering paste, any one of an Ag sintering paste containing silver particles, an AL sintering paste containing aluminum particles, and a Cu sintering paste containing copper particles can be used.

A sintering paste such as described above is provided between the power semiconductor chip 1 and the Cu circuit 3 and laminated, and as a result of a sintering step, the power semiconductor chip 1 and the Cu circuit 3 are joined by the sintering layer 2. The Cu circuit 3 and the lead frame 6 are joined by the sintering layer 2.

In the sintering layer 2, a sintering network based on metal particles (metal bond bath) is formed, and high thermal conductivity and low electrical resistance are realized. From the viewpoint of improving the joining properties provided by the sintering layer 2, the Cu circuit 3 and the lead frame 6 may be subjected to a surface treatment by plating with the metal contained in the sintering paste. Specifically, in the present embodiment, the surfaces of the Cu circuit 3 and the lead frame 6 may be subjected to Ag plating.

<Cu Circuit 3>

The Cu circuit 3 is a metal circuit board constructed from a metal material having conductivity. A power semiconductor chip 1 is provided over a circuit pattern formed on one surface (upper surface in the drawing) of the Cu circuit 3, with the sintering layer 2 as a joining layer interposed therebetween.

The Cu circuit 3 is a circuit board obtained by patterning thick copper (rolled copper) and has a thickness of, for example, equal to or more than 0.3 mm and equal to or less than 5 mm. As the metal material constituting the Cu circuit 3, for example, thick copper (rolled copper) can be suitably used. As a result, the Cu circuit 3 has a relatively small resistance value. At least a portion of the Cu circuit 3 may be covered with a solder resist layer.

The Cu circuit 3 is formed by, for example, cutting and etching a metal layer (thick copper or the like) that is laminated over the upper surface of a base part 5A of a Cu base plate 5, with a heat dissipation sheet 4 interposed therebetween, into a predetermined pattern, or a metal layer in a state of being processed in advance into a predetermined pattern is stuck to the Cu circuit 3 by using the heat dissipation sheet 4.

The lower limit value of the thickness of the Cu circuit 3 is, for example, equal to or more than 0.3 mm. When the thickness is equal to or more than such a numerical value, heat generation of the circuit pattern can be suppressed even in a use application requiring a high current. Furthermore, the upper limit value of the thickness of the circuit pattern 20 is, for example, equal to or less than 5.0 mm, preferably equal to or less than 4.0 mm, and more preferably equal to or less than 3.0 mm. When the thickness is equal to or less than such a numerical value, circuit processability can be improved, and thickness reduction of the substrate as a whole can be promoted.

<Heat Dissipation Sheet 4>

The heat dissipation sheet 4 is disposed between the Cu circuit 3 and the Cu base plate 5. The heat of the power semiconductor chip 1 is received at the Cu circuit 3 and is further transferred through the heat dissipation sheet 4 to the Cu base plate 5, which is a heat dissipation unit. As a result, the heat generated from the power semiconductor chip 1, which is a heating element, can be effectively dissipated to the outside of the power module 10 while maintaining the insulation properties of the power module 10. Therefore, it is possible to improve the insulation reliability of the semiconductor device.

The planar shape of the heat dissipation sheet 4 is not particularly limited and can be appropriately selected according to the shape of the Cu circuit 3 or the Cu base plate 5; however, for example, the planar shape can be a rectangular shape. The film thickness of the heat dissipation sheet 4 is, for example, equal to or more than 50 μm and equal to or less than 250 μm. As a result, the heat of the Cu circuit 3 can be transferred more effectively to the Cu base plate 5 while promoting improvement in the mechanical strength and thermal resistance. Furthermore, the heat dissipation sheet 4 has an excellent balance between heat dissipation properties and insulation properties. The thermal conductivity of the heat dissipation sheet 4 is not particularly limited; however, a heat dissipation sheet having a thermal conductivity of preferably equal to or higher than 10 W/mK (175° C.), and more preferably equal to or higher than 15 W/mK (175° C.), is used.

[Material of Heat Dissipation Sheet 4]

The heat dissipation sheet 4 is, for example, a resin sheet and is formed by using a resin composition for a sheet. The resin composition for a sheet will be described below.

In the present embodiment, it is preferable that the resin composition for a sheet includes a thermosetting resin (A), a filler (B), a curing agent (C), and the like. When a thermosetting resin is included, the heat-dissipating insulating sheet is a product obtained by B-staging the thermosetting resin (A).

[Thermosetting Resin (A)]

Examples of the thermosetting resin (A) include an epoxy resin, a cyanate resin, a polyimide resin, a benzoxazine resin, an unsaturated polyester resin, a phenol resin, a melamine resin, a silicone resin, a bismaleimide resin, a phenoxy resin, and an acrylic resin. As the thermosetting resin (A), one kind of these may be used alone, or two or more kinds thereof may be used in combination.

Above all, from the viewpoint of having high insulation properties, the thermosetting resin (A) is preferably an epoxy resin, a phenol resin, or a phenoxy resin.

Examples of the epoxy resin include bisphenol type epoxy resins such as a bisphenol A type epoxy resin, a bisphenol F type epoxy resin, a bisphenol E type epoxy resin, a bisphenol S type epoxy resin, a bisphenol M type epoxy resin (4,4'-(1,3-phenylenediisopridiene) bisphenol type epoxy resin), a bisphenol P type epoxy resin (4,4'-(1,4-phenylenediisopridiene) bisphenol type epoxy resin), and a bisphenol Z type epoxy resin (4,4'-cyclohexadiene bisphenol type epoxy resin); novolac type epoxy resins such as a phenol novolac type epoxy resin, a cresol novolac type epoxy resin, a trisphenol group methane type novolac type epoxy resin, a tetraphenol group ethane type novolac type epoxy resin, and a novolac type epoxy resin having a fused ring aromatic hydrocarbon structure; biphenyl type epoxy resins; arylalkylene type epoxy resins such as a xylylene type epoxy resin and a biphenyl aralkyl type epoxy resin; naphthalene type epoxy resins such as a naphthylene ether type epoxy resin, a naphthol type epoxy resin, a naphthalene diol type epoxy resin, a bifunctional to tetrafunctional epoxy-type naphthalene resin, a binaphthyl type epoxy resin, and a naphthalene aralkyl type epoxy resin; anthracene type epoxy resins; phenoxy type epoxy resins; dicyclopentadiene type epoxy resins; norbornene type epoxy resins; adamantane type epoxy resins; and fluorene type epoxy resins. One kind of these may be used alone, or two or more kinds thereof may be used in combination.

Among the epoxy resins, from the viewpoint that thermal resistance and insulation reliability can be further improved, the epoxy resin is preferably one kind or two or more kinds selected from the group consisting of a bisphenol type epoxy resin, a novolac type epoxy resin, a biphenyl type epoxy resin, an arylalkylene type epoxy resin, a naphthalene type epoxy resin, an anthracene type epoxy resin, and a dicyclopentadiene type epoxy resin.

Examples of the phenol resin include novolac type phenol resins such as a phenol novolac resin, a cresol novolac resin, and a bisphenol A novolac resin; and resol type phenol resins. One kind of these may be used alone, or two or more kinds thereof may be used in combination.

Among the phenol resins, a phenol novolac resin is preferred.

The content of the thermosetting resin (A) is preferably equal to or more than 1% by mass, and more preferably equal to or more than 5% by mass, with respect to the total amount of the resin composition for a sheet. On the other hand, this content is preferably equal to or less than 30% by mass, and more preferably equal to or less than 20% by mass, with respect to the total amount of the resin composition for a sheet.

When the content of the thermosetting resin (A) is equal to or more than the above-described lower limit value, handleability of the resin composition for a sheet is improved, it is made easier to form a heat-dissipating insulating sheet, and at the same time, the strength of the heat-dissipating insulating sheet is improved.

When the content of the thermosetting resin (A) is equal to or less than the above-described upper limit value, the linear expansion coefficient and elastic modulus of the heat-dissipating insulating sheet are further improved, and the thermal conductivity is even further improved.

[Filler (B)]

The filler (B) according to the present embodiment is used from the viewpoint of improving the thermal conductivity of the heat-dissipating insulating sheet and also obtaining strength.

The filler (B) is preferably a thermally conductive filler. More specifically, from the viewpoint of promoting a balance between thermal conductivity and electrical insulation properties, examples of the filler (B) include silica, alumina, boron nitride, aluminum nitride, and silicon carbide. These may be used singly, or two or more kinds thereof may be used in combination. Above all, the filler (B) is preferably alumina or boron nitride.

The content of the filler (B) is preferably equal to or less than 90% by mass, and more preferably equal to or less than 80% by mass, with respect to the total amount of the resin composition for a sheet. On the other hand, from the viewpoint of thermal conductivity, this content is preferably equal to or more than 40% by mass, and more preferably equal to or more than 50% by mass, with respect to the total amount of the resin composition for a sheet.

(Curing Agent (C))

When an epoxy resin or a phenol resin is used as the thermosetting resin (A), it is preferable that the resin composition for a sheet further includes a curing agent (C).

As the curing agent (C), one or more selected from a curing catalyst (C-1) and a phenolic curing agent (C-2) can be used.

Examples of the curing catalyst (C-1) include organic metal salts such as zinc naphthenate, cobalt naphthenate, tin octylate, cobalt octylate, cobalt(II) bisacetylacetonate, and cobalt(III) trisacetylacetonate; tertiary amines such as triethylamine, tributylamine, and 1,4-diazabicyclo[2.2.2]octane; imidazoles such as 2-phenyl-4-methylimidazole, 2-ethyl-4-methylimidazole, 2,4-diethylimidazole, 2-phenyl-4-methyl-5-hydroxyimidazole, and 2-phenyl-4,5-dihydroxymethylimidazole; organophosphorus compounds such as triphenylphosphine, tri-p-tolylphosphine, tetraphenylphosphonium tetraphenylborate, triphenylphosphine triphenylborane, 1,2-bis-(diphenylphosphino)ethane; phenol compounds such as phenol, bisphenol A, and nonylphenol; organic acids such as acetic acid, benzoic acid, salicylic acid, and p-toluenesulfonic acid; and mixtures of these. As the curing catalyst (C-1), one kind among these, including derivatives thereof, may be used alone, or two or more kinds of these, including derivatives thereof, may be used in combination.

The content of the curing catalyst (C-1) is not particularly limited; however, the content is preferably equal to or more than 0.001% by mass and equal to or less than 1% by mass with respect to the total amount of the resin composition for a sheet.

Examples of the phenolic curing agent (C-2) include novolac type phenol resins such as a phenol novolac resin, a cresol novolac resin, a trisphenolmethane type novolac resin, a naphthol novolac resin, and an aminotriazine novolac resin; modified phenol resins such as a terpene-modified phenol resin and a dicyclopentadiene-modified phenol resin; aralkyl type resins such as a phenol aralkyl resin having a phenylene skeleton and/or a biphenylene skeleton, and a naphthol aralkyl resin having a phenylene skeleton and/or a biphenylene skeleton; bisphenol compounds such as bisphenol A and bisphenol F; and resol type phenol resins, and these may be used singly or in combination of two or more kinds thereof.

Among these, from the viewpoint of increasing the glass transition temperature and lowering the linear expansion coefficient, the phenolic curing agent (C-2) is preferably a novolac type phenol resin or a resol type phenol resin.

The content of the phenolic curing agent (C-2) is not particularly limited; however, the content is preferably equal to or more than 1% by mass, and more preferably equal to or more than 5% by mass, with respect to the total amount of the resin composition for a sheet. On the other hand, this content is preferably equal to or less than 30% by mass, and more preferably equal to or less than 15% by mass, with respect to the total amount of the resin composition for a sheet.

[Coupling Agent (D)]

The resin composition for a sheet may include a coupling agent (D). The coupling agent (D) can improve the wettability of the interface between the thermosetting resin (A) and the filler (B).

The coupling agent (D) is not particularly limited; however, for example, it is preferable to use one kind or two or more kinds of coupling agents selected from an epoxysilane coupling agent, a cationic silane coupling agent, an aminosilane coupling agent, a titanate-based coupling agent, and a silicone oil type coupling agent.

The content of the coupling agent (D) is not particularly limited; however, the content is preferably equal to or more than 0.05% by mass, and more preferably equal to or more than 0.1% by mass, with respect to 100% by mass of the filler (B). On the other hand, this content is preferably equal to or less than 3% by mass, and more preferably equal to or less than 2% by mass, with respect to 100% by mass of the filler (B).

[Phenoxy Resin (E)]

In addition, the resin composition for a sheet may include a phenoxy resin (E). By including the phenoxy resin (E), the bending resistance of the heat-dissipating insulating sheet can be improved.

Furthermore, by including the phenoxy resin (E), it is possible to lower the elastic modulus of the heat-dissipating insulating sheet, and the stress relaxation power of the heat-dissipating insulating sheet can be improved.

Furthermore, when the phenoxy resin (E) is included, the fluidity is reduced due to an increase in viscosity, and the occurrence of voids and the like can be suppressed. Furthermore, when the heat-dissipating insulating sheet is adhered to a metal member and used, the adhesiveness between the metal and a cured body of the resin composition for a sheet can be improved. As a result of a synergistic effect of these, the insulation reliability of the semiconductor device can be further enhanced.

Examples of the phenoxy resin (E) include a phenoxy resin having a bisphenol skeleton, a phenoxy resin having a naphthalene skeleton, a phenoxy resin having an anthracene skeleton, and a phenoxy resin having a biphenyl skeleton. Furthermore, a phenoxy resin having a structure having a plurality of these skeletons can also be used.

The content of the phenoxy resin (E) is preferably, for example, equal to or more than 3% by mass and equal to or less than 10% by mass with respect to the total amount of the resin composition for a sheet.

(Other Components)

The resin composition for a sheet may further include an oxidation inhibitor, a leveling agent, and the like to the extent that the effects of the present invention are not impaired.

<Cu Base Plate 5>

The Cu base plate 5 is a type of heat dissipation member and has a plate-shaped base part 5A made of copper, and a plurality of fin parts 5B integrally extending from the lower surface of the base part 5A.

Apart from the Cu base plate 5, for example, an aluminum base plate may be employed as the heat dissipation member. Furthermore, the heat dissipation member is not limited to a general heat dissipation member as long as it has a function of acquiring the heat generated by the power semiconductor chip 1 through the Cu circuit 3 and then releasing the heat elsewhere, and the heat dissipation member may be apart of another configuration (for example, a housing), or the like. Even in that case, the heat dissipation sheet 4 is used.

<Lead Frame 6>

The lead frame 6 is a component that supports and fixes the power semiconductor chip 1 and provides electrical connection to external wiring, and is a component produced by subjecting a thin plate of a metal material such as copper or iron to press working, etching processing, or the like.

<Sealing Material 7>

The sealing material 7 is, for example, a molding resin and internally integrally seals the power semiconductor chip 1, the sintering layer 2, the Cu circuit 3, the heat dissipation sheet 4, the Cu base plate 5, and the lead frame 6. Apart from the molding resin, silicone gel or the like may be used as the sealing material 7. In the following description, a configuration that is integrally sealed with a molding resin will be described.

In this sealing, a portion of the lead frame 6 is sealed, and the other portion that is not sealed is connected to an external device. Furthermore, with regard to the Cu base plate 5, the upper surface and side surfaces of the base part 5A of the Cu base plate 5 are covered and sealed with the sealing material 7. The lower surface of the Cu base plate 5 and the fin parts 5B are not covered with the sealing material 7. That is, the sealing material 7 covers and seals the power semiconductor chip 1 so as to cover a portion or the entirety of the side surfaces in the thickness direction of the base part 5A of the Cu base plate 5. Here, a configuration in which all side surfaces of the base part 5A of the Cu base plate 5 are covered with the sealing material 7 is shown as an example.

[Components of Sealing Material 7 (Molding Resin)]

The molding resin of the sealing material 7 is a cured body of a thermosetting composition (C) including a thermosetting resin (A) and an inorganic filler material (B). The thermosetting composition (C) includes a curing accelerator (D).

[Curing Accelerator (D)]

The curing accelerator (D) of the present embodiment is a strongly active agent. As a result, when the thermosetting composition is used as it is without any special measures while low-temperature curing is realized, the reaction proceeds during storage, and the storage stability deteriorates.

Examples of the curing accelerator (D) include phosphorus atom-containing compounds such as an organic phosphine, a tetrasubstituted phosphonium compound, a phosphobetaine compound, an adduct of a phosphine compound and a quinone compound, and an adduct of a phosphonium compound and a silane compound; amidine-based compounds such as 1,8-diazabicyclo(5,4,0)undecene-7 and imidazole; tertiary amines such as benzyldimethylamine; and nitrogen atom-containing compounds such as an amidinium salt and an ammonium salt.

Above all, it is preferable that the curing accelerator (D) is an imidazole-based curing accelerator or a phosphorus-based curing accelerator. As the imidazole-based curing accelerator, it is more preferable that, for example, an imidazole compound of an amidine-based compound is included. Examples of the imidazole compound include, but are not limited to, 2-methylimidazole, 2-phenylimidazole, imidazole-2-carboaldehyde, 5-azabenzimidazole, and 4-azabenzimidazole. Among them, 2-methylimidazole is preferably used.

The content of the curing accelerator (D) in a sealing resin composition is not particularly limited; however, for example, the content is preferably equal to or more than 0.1% by mass and equal to or less than 5% by mass, and more preferably equal to or more than 0.2% by mass and equal to or less than 4% by mass, with respect to the entire sealing resin composition.

By setting the content of the curing accelerator (D) to be equal to or more than the above-described lower limit value, it is easier to appropriately cure the sealing resin composition. On the other hand, by setting the content of the curing accelerator (D) to be equal to or less than the above-described upper limit value, a molten state can be prolonged, a low-viscosity state can be prolonged, and as a result, low-temperature sealing is easily realized.

[Thermosetting Resin (A)]

Examples of the thermosetting resin (A) include a phenol resin, an epoxy resin, an unsaturated polyester resin, a melamine resin, and a polyurethane. These may be used singly, or two or more kinds thereof may be used in combination. Above all, it is preferable that at least one of a phenol resin and an epoxy resin is included, and it is more preferable that an epoxy resin is included.

As the epoxy resin, all monomers, oligomers, and polymers having two or more epoxy groups in one molecule can be used, and the molecular weight and the molecular structure are not particularly limited.

Specific examples of the epoxy resin include bisphenol type epoxy resins such as a biphenyl type epoxy resin, a bisphenol A type epoxy resin, a bisphenol F type epoxy resin, and a tetramethyl bisphenol F type epoxy resin; crystalline epoxy resins such as a stilbene type epoxy resin and a hydroquinone type epoxy resin; novolac type epoxy resins such as a cresol novolac type epoxy resin, a phenol novolac type epoxy resin, and a naphthol novolac type epoxy resin; aralkyl type epoxy resins such as a phenylene skeleton-containing phenol aralkyl type epoxy resin, a biphenylene skeleton-containing phenol aralkyl type epoxy resin, a phenylene skeleton-containing naphthol aralkyl epoxy resin, and an alkoxynaphthalene skeleton-containing phenol aralkyl epoxy resin; trifunctional epoxy resins such as a triphenolmethane type epoxy resin and an alkyl-modified triphenolmethane type epoxy resin; modified phenol type epoxy resins such as a dicyclopentadiene-modified phenol type epoxy resin and a terpene-modified phenol type epoxy resin; and heterocyclic ring-containing epoxy resins such as a triazine nucleus-containing epoxy resin. These may be used singly, or two or more kinds thereof may be used in combination. Among these, it is more preferable to use at least one of an aralkyl type epoxy resin and a naphthyl ether type epoxy resin, from the viewpoint of improving the balance between reliability and moldability of an aluminum electrolytic condenser.

It is suitable that the ICI viscosity at 150° C. of the thermosetting resin (A) is appropriately set according to the content of the inorganic filler material (B); however, for example, the upper limit value is preferably equal to or less than 60 poise, more preferably equal to or less than 50 poise, and even more preferably equal to or less than 40 poise. As a result, the fluidity of the sealing resin composition is improved, and low-temperature sealing is easily realized.

On the other hand, the lower limit value of the ICI viscosity at 150° C. of the thermosetting resin (A) is not particularly limited; however, the lower limit value may be, for example, equal to or more than 0.01 poise.

Meanwhile, 1 poise is 0.1 Pa-s.

The content of the thermosetting resin (A) is not particularly limited; however, for example, the content is preferably equal to or more than 1% by mass and equal to or less than 50% by mass, more preferably equal to or more than 2% by mass and equal to or less than 30% by mass, and even more preferably equal to or more than 5% by mass and equal to or less than 20% by mass, with respect to the entire sealing resin composition.

By setting the content of the thermosetting resin (A) to be equal to or more than the above-described lower limit value, the fluidity and moldability of the sealing resin composition can be more effectively improved. Furthermore, by setting the content of the thermosetting resin (A) to be equal to or less than the upper limit value, the reliability of the aluminum electrolytic condenser can be improved more effectively.

[Inorganic Filler Material (B)]

Examples of the inorganic filler material (B) include silica, alumina, kaolin, talc, clay, mica, rock wool, wollastonite, glass powder, glass flakes, glass beads, glass fibers, silicon carbide, silicon nitride, aluminum nitride, carbon black, graphite, titanium dioxide, calcium carbonate, calcium sulfate, barium carbonate, magnesium carbonate, magnesium sulfate, barium sulfate, cellulose, aramid, and wood. These may be used singly, or two or more kinds thereof may be used as a mixture.

Examples of the above-described silica include crystalline silica (crushed crystalline silica), fused silica (crushed amorphous silica, spherical amorphous silica), and liquid sealing silica (spherical amorphous silica for liquid sealing). Among these, fused spherical silica is preferred from the viewpoint of facilitating the realization of low-temperature, low-pressure sealing.

The average particle size of the inorganic filler (B) is not particularly limited; however, the average particle size is typically 1 to 100 μm, preferably 1 to 50 μm, and more preferably 1 to 20 μm. It is thought that as the average particle size is appropriate, an effect in which a shell including a molten mixture is coated more uniformly in the granulation step that will be described below is obtained. Furthermore, when the finally obtained core-shell particles are used as a semiconductor sealing material, the property of filling around the semiconductor element in the mold cavity can be enhanced.

The volume-based particle size distribution of the inorganic filler material (B) can be measured with a commercially available laser-type particle size distribution meter (for example, manufactured by Shimadzu Corporation, SALD-7000).

The content of the inorganic filler material (B) is not particularly limited; however, for example, the content is preferably equal to or more than 50% by mass and equal to or less than 95% by mass, more preferably equal to or more than 60% by mass and equal to or less than 95% by mass, and even more preferably equal to or more than 65% by mass and equal to or less than 85% by mass, with respect to the entire sealing resin composition.

By setting the content of the inorganic filler material (B) to be equal to or more than the above-described lower limit value, the reliability of the aluminum electrolytic condenser sealed with the sealing resin composition can be effectively improved. Furthermore, by setting the content of the inorganic filler material (B) to be equal to or less than the above-described upper limit value, it is possible to improve the fluidity of the sealing resin composition and improve moldability more effectively.

The sealing resin composition of the present embodiment may include the following components in addition to the above-described components.

(Curing Agent (C))

The sealing resin composition can include a curing agent (C). The curing agent (C) is not particularly limited as long as it is reacts with the thermosetting resin (A) and cures the resin, and examples thereof include amines, including linear aliphatic diamines having 2 to 20 carbon atoms such as ethylenediamine, trimethylenediamine, tetramethylenediamine, and hexamethylenediamine, as well as metaphenylenediamine, paraphenylenediamine, paraxylenediamine, 4,4'-diaminodiphenylmethane, 4,4'-diaminodiphenylpropane, 4,4'-diaminodiphenyl ether, 4,4'-diaminodiphenylsulfone, 4,4'-diaminodicyclohexane, bis(4-aminophenyl) phenylmethane, 1,5-diaminonaphthalene, metaxylenediamine, paraxylenediamine, 1,1-bis(4-aminophenyl)cyclohexane, and dicyanodiamide; resol type phenol resins such as an aniline-modified resol resin and a dimethyl ether resol resin; novolac type phenol resins such as a phenol novolac resin, a cresol novolac resin, a tert-butyl phenol novolac resin, and a nonyl phenol novolac resin; phenol aralkyl resins such as a phenylene skeleton-containing phenol aralkyl resin and a biphenylene skeleton-containing phenol aralkyl resin; phenol resins having a fused polycyclic structures such as a naphthalene skeleton or an anthracene skeleton; polyoxystyrenes such as polyparaoxystyrene; acid anhydrides, including alicyclic acid anhydrides such as hexahydrophthalic anhydride (HHPA) and methyltetrahydrophthalic anhydride (MTHPA), aromatic acid anhydrides such as trimellitic anhydride (TMA), pyromellitic anhydride (PMDA), and benzophenonetetracarboxylic acid (BTDA); polymercaptan compounds such as a polysulfide, a thioester, and a thioether; isocyanate compounds such as an isocyanate prepolymer and a blocked isocyanate; and organic acids such as a carboxylic acid-containing polyester resin. These may be used singly, or two or more kinds thereof may be used in combination. Among these, from the viewpoint of realizing low-temperature, low-pressure sealing by the sealing resin composition, it is more preferable to use at least one of a novolac type phenol resin or a phenol aralkyl resin.

The content of the curing agent (C) in the sealing resin composition is not particularly limited; however, for example, the content is preferably equal to or more than 1% by mass and equal to or less than 12% by mass, and more preferably equal to or more than 3% by mass and equal to or less than 10% by mass, with respect to the entire sealing resin composition.

By setting the content of the curing agent (C) to be equal to or more than the above-described lower limit value, it is easy to appropriately cure the sealing resin composition. On the other hand, by setting the content of the curing agent (C) to be equal to or less than the above-described upper limit value, it is easy to maintain appropriate fluidity and realize low-temperature, low-pressure sealing.

[Coupling Agent (E)]

The sealing resin composition can include, for example, a coupling agent (E). Regarding the coupling agent (E), for example, known coupling agents such as various silane-based compounds such as epoxysilane, mercaptosilane, aminosilane, alkylsilane, ureidosilane, and vinylsilane; titanium-based compounds, aluminum chelates, and aluminum/zirconium-based compounds, can be used.

More specifically, silane-based coupling agents such as vinyltrichlorosilane, vinyltrimethoxysilane, vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, γ-glycidoxypropyltriethoxysilane, γ-glycidoxypropylmethyldimethoxysilane, γ-methacryloxypropylmethyldiethoxysilane, γ-methacryloxypropyltriethoxysilane, vinyltriacetoxysilane, γ-mercaptopropyltrimethoxysilane, γ-aminopropyltriethoxysilane, γ-anilinopropyltrimethoxysilane, γ-anilinopropylmethyldimethoxysilane, γ-[bis(RB-hydroxyethyl)]aminopropyltriethoxysilane, N-β-(aminoethyl)-γ-aminopropyltrimethoxysilane, N-β-(aminoethyl)-γ-aminopropyltriethoxysilane, N-β-(aminoethyl)-γ-aminopropylmethyldimethoxysilane, N-phenyl-γ-aminopropyltrimethoxysilane, γ-(β-aminoethyl) aminopropyldimethoxymethylsilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, N-β-(N-vinylbenzylaminoethyl)-γ-aminopropyltrimethoxysilane, γ-chloropropyltrimethoxysilane, hexamethyldisilane, vinyltrimethoxysilane, γ-mercaptopropylmethyldimethoxysilane, 3-isocyanatopropyltriethoxysilane, 3-acryloxypropyltrimethoxysilane, and hydrolysate of 3-triethoxysilyl-N-(1, 3-dimethylbutylidene)propylamine; and titanate-based coupling agents such as isopropyltriisostearoyl titanate, isopropyl tris(dioctyl pyrophosphate) titanate, isopropyl tri (N-aminoethyl-aminoethyl) titanate, tetraoctyl bis(ditridecyl phosphite) titanate, tetra(2,2-diallyloxymethyl-1-butyl) bis (ditridecyl) phosphite titanate, bis(dioctyl pyrophosphate) oxyacetate titanate, bis (dioctyl pyrophosphate) ethylene titanate, isopropyl trioctanoyl titanate, isopropyl dimethacryl isostearoyl titanate, isopropyl tridodecylbenzenesulfonyl titanate, isopropyl isostearoyl diacryl titanate, isopropyl tri(dioctyl phosphate) titanate, isopropyl tricumylphenyl titanate, and tetraisopropyl bis(dioctyl phosphite) titanate, may be mentioned. These may be used singly, or two or more kinds thereof may be used in combination.

The content of the coupling agent (E) in the sealing resin composition is not particularly limited; however, for example, the content is preferably equal to or more than 0.05% by mass and equal to or less than 3% by mass, and more preferably equal to or more than 0.1% by mass and equal to or less than 2% by mass, with respect to the entire sealing resin composition. By setting the content of the coupling agent (E) to be equal to or more than the above-described lower limit value, satisfactory dispersibility of the inorganic filler material (B) in the sealing resin composition can be obtained. Furthermore, by setting the content of the coupling agent (E) to be equal to or less than the above-described upper limit value, satisfactory fluidity of the sealing resin composition can be obtained, and improvement in the moldability can be promoted.

In addition, the sealing resin composition of the present embodiment can include, in addition to the above-described components, for example, various additives such as a coloring agent such as carbon black; a mold release agent such as natural wax, synthetic wax, a higher fatty acid or a metal salt thereof, paraffin, or polyethylene oxide; an ion scavenger such as hydrotalcite; a low stress agent such as silicone oil or silicone rubber; a flame retardant such as aluminum hydroxide; and an oxidation inhibitor.

<Thermal Resistance in First and Second Laminated Structures>

The thermal resistance in the laminated structure of the power module 10 will be described.

<First Laminated Structure>

With regard to the power module 10, a structure in which a power semiconductor chip 1, a sintering layer 2 (also referred to as "first joining layer"), a Cu circuit 3 (also referred to as "first metal circuit board"), and a heat dissipation sheet 4 (also referred to as "first heat dissipation sheet") are laminated is designated as a first laminated structure (also referred to as a "laminated structure A"). At this time, with regard to the first laminated structure, the total thermal resistance XA in the direction of lamination (height direction) is equal to or less than 0.30 (K/W). The lower limit of the total thermal resistance XA is not particularly limited; however, as a realistic value, the lower limit is equal to or more than 0.05, preferably equal to or more than 0.06 (K/W), and more preferably equal to or more than 0.07 (K/W). The upper limit of the total thermal resistance XA is preferably equal to or less than 0.25 (K/W), and more preferably equal to or less than 0.20 (K/W).

When the total thickness of the first laminated structure is designated as tA (mm), the ratio XA/tA of the total thermal resistance XA and the total thickness tA is equal to or less than 0.25 (W/(K·mm)). The lower limit of the ratio XA/tA is not particularly limited; however, as a realistic value, the lower limit is equal to or more than 0.02 (W/(K·mm)), preferably equal to or more than 0.03 (W/(K·mm)), and more preferably 0.04 (W/(K·mm)).

<Second Laminated Structure>

A structure in which a power semiconductor chip 1, a sintering layer 2, a Cu circuit 3, a heat dissipation sheet 4, and a Cu base plate 5 are laminated is referred to as a second laminated structure (also referred to as "laminated structure B"). That is, the second laminated structure is a structure in which a Cu base plate 5 is further laminated on the lower side of the heat dissipation sheet 4 of the first laminated structure.

With regard to the second laminated structure, the total thermal resistance XB in the direction of lamination (height direction) is equal to or less than 0.45 (K/W). The lower limit of the total thermal resistance XB is not particularly limited; however, as a realistic value, the lower limit is equal to or more than 0.10 (K/W), preferably equal to or more than 0.12 (K/W), and more preferably equal to or more than 0.15 (K/W). The upper limit of the total thermal resistance XB is preferably equal to or less than 0.35 (K/W), and more preferably equal to or less than 0.25 (K/W).

When the total thickness of the second laminated structure is designated as tB (mm), the ratio XB/tB of the total thermal resistance XB and the total thickness tB is equal to or less than 0.08 (W/(K·mm)). The lower limit of the ratio XB/tB is not particularly limited; however, as a realistic value, the lower limit is equal to or more than 0.01 (W/(K·mm)), preferably equal to or more than 0.02 (W/(K·mm)), and more preferably 0.03 (W/(K·mm)).

<Features and Effects of Power Module 10>

The features and effects of the present embodiment are summarized as follows.

(1) The power module 10 of the present embodiment is a power module (10) having a power semiconductor chip 1 and a Cu circuit 3 having the power semiconductor chip 1 provided on one surface, the power module having: a sintering layer 2 (sintering layer) that joins the power semiconductor chip 1 and the Cu circuit 3 (metal circuit board) with a sintering paste; and a heat dissipation sheet 4 that is provided for joining a Cu base plate 5 (heat dissipation member) on the other surface of the Cu circuit 3, in which in the first laminated structure in which the power semiconductor chip 1, the sintering layer 2, the Cu circuit 3, and the heat dissipation sheet 4 are laminated, the total thermal resistance XA in the direction of lamination is equal to or less than 0.30 (K/W).

By adopting such a configuration, the heat dissipation performance of the power module 10 can be satisfactorily realized.

Specifically, for joining the power semiconductor chip 1 and the Cu circuit 3, a sintering layer 2 (sintering paste) was used instead of the conventionally used solder. Since the sintering layer 2 (sintering paste) has a high thermal conductivity, the heat generated by the power semiconductor chip 1 can be effectively released to the outside.

Furthermore, for connecting the Cu circuit 3 and a member having a heat dissipation function, such as the Cu base plate 5, a heat dissipation sheet 4 was used instead of the conventionally used solder. As a result, the heat generated by the power semiconductor chip 1 can be effectively released to the outside.

As a result, the maximum temperature in the power semiconductor chip 1 can be lowered, and improvement in electrical characteristics can be realized. Furthermore, as the heat dissipation properties are improved, thermal stress in continued use is reduced, and the reliability of joint parts such as those of the sintering layer 2 and the heat dissipation sheet 4 is improved.

(2) A Cu base plate 5 (heat dissipation member) joined to the other surface of the Cu circuit 3 by using a heat dissipation sheet 4 is further included.

(3) With regard to the second laminated structure in which the power semiconductor chip 1, the sintering layer 2, the Cu circuit 3, the heat dissipation sheet 4, and the Cu base plate 5 are laminated, the total thermal resistance XB in the direction of lamination is equal to or less than 0.45 (K/W).

(4) The metal particles contained in the sintering paste are any of silver particles, aluminum particles, or copper particles. That is, by using any one sintering paste among an Ag sintering paste, an Al sintering paste, and a Cu sintering paste, the thermal resistance of the sintering layer 2 can be lowered to a large extent as compared with the case of solder. That is, the heat dissipation properties can be improved.

(5) A sealing material 7 covering the power semiconductor chip 1 is further included.

With such a sealing material 7, it is easy to cope with size reduction and thickness reduction for the power module having the power semiconductor chip 1.

(6) The sealing material 7 is formed from a molding resin.

By using a molding resin as the sealing material 7, it is much easier to cope with size reduction and thickness reduction for the power module having the power semiconductor chip 1.

(7) The sealing material 7 covers and seals the power semiconductor chip 1 so as to cover a portion or the entirety of side surfaces in the thickness direction of the Cu base plate 5 (more specifically, the base part 5A).

By adopting a configuration in which a portion or the entirety of the Cu base plate 5 is covered with the sealing material 7, it is easy to achieve a balance between strength and heat dissipation properties as the power module 10.

(8) The Cu circuit 3 is a circuit board obtained by patterning thick copper (rolled copper) and has a thickness of equal to or more than 0.3 mm and equal to or less than 5 mm. By forming the Cu circuit 3 having such a thickness, a satisfactory balance between the thermal resistance and the strength of the Cu circuit 3 can be achieved, and the heat dissipation properties can be improved.

(9) When the total thermal resistance in the direction of lamination of the first laminated structure is designated as XA (K/W), and the total thickness of the first laminated structure is designated as tA (mm), the ratio XA/tA is equal to or less than 0.25 (K/(W·mm)).

Due to such a configuration, it is easy to cope with high heat dissipation properties and size reduction as well as thickness reduction for the power module 10.

(10) When the total thermal resistance in the direction of lamination of the second laminated structure is designated as XB (K/W), and the total thickness of the second laminated structure is designated as tB (mm), the ratio XB/tB is equal to or less than 0.08 (K/(W·mm)).

Due to such a configuration, it is much easy to cope with high heat dissipation properties and size reduction as well as thickness reduction for the power module 10 including the Cu base plate 5.

Second Embodiment

Overview of Invention

<Power Module 100>

Figure 7:
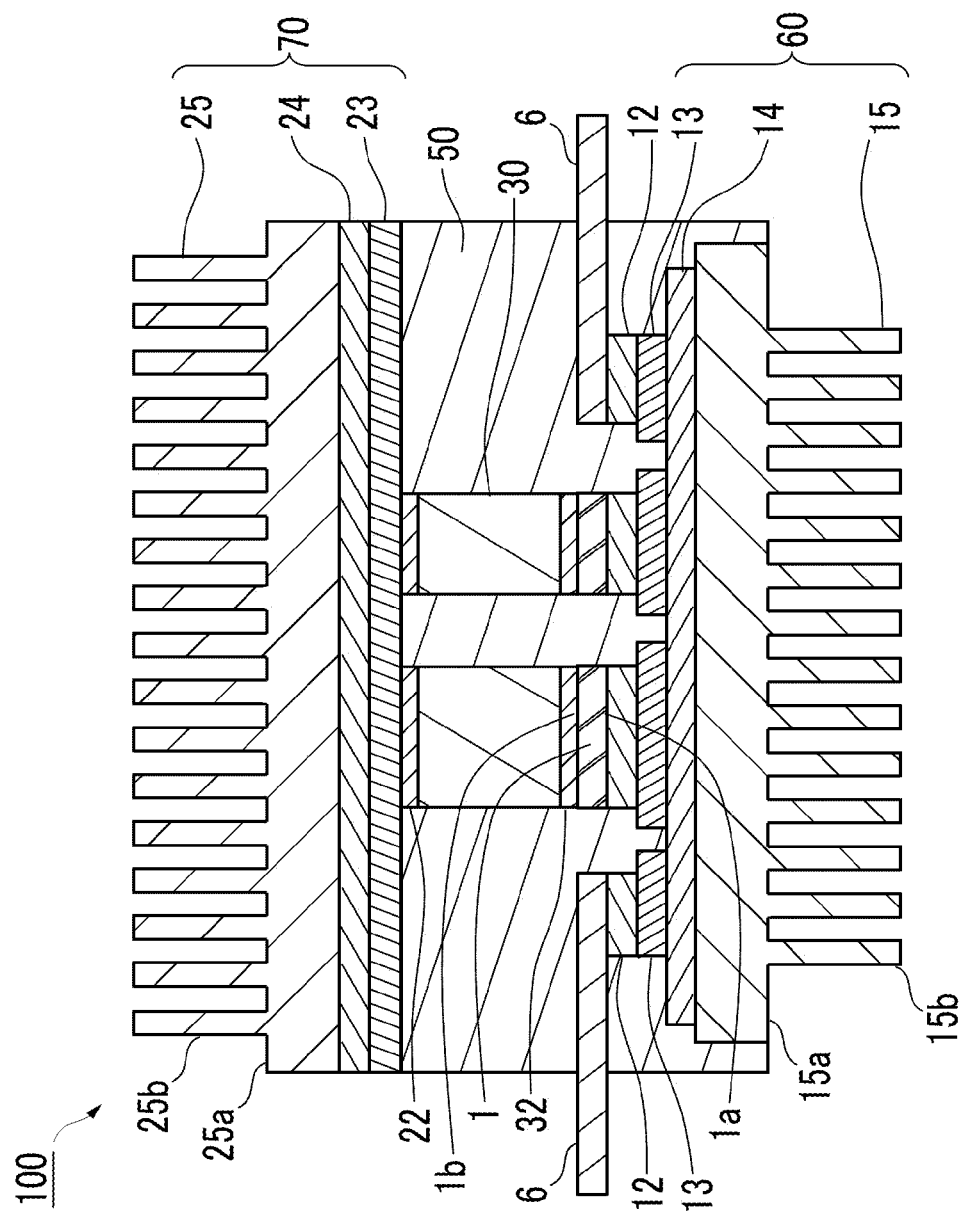
FIG. 7 is a cross-sectional view schematically showing a power module of a second embodiment.
Figure 8:
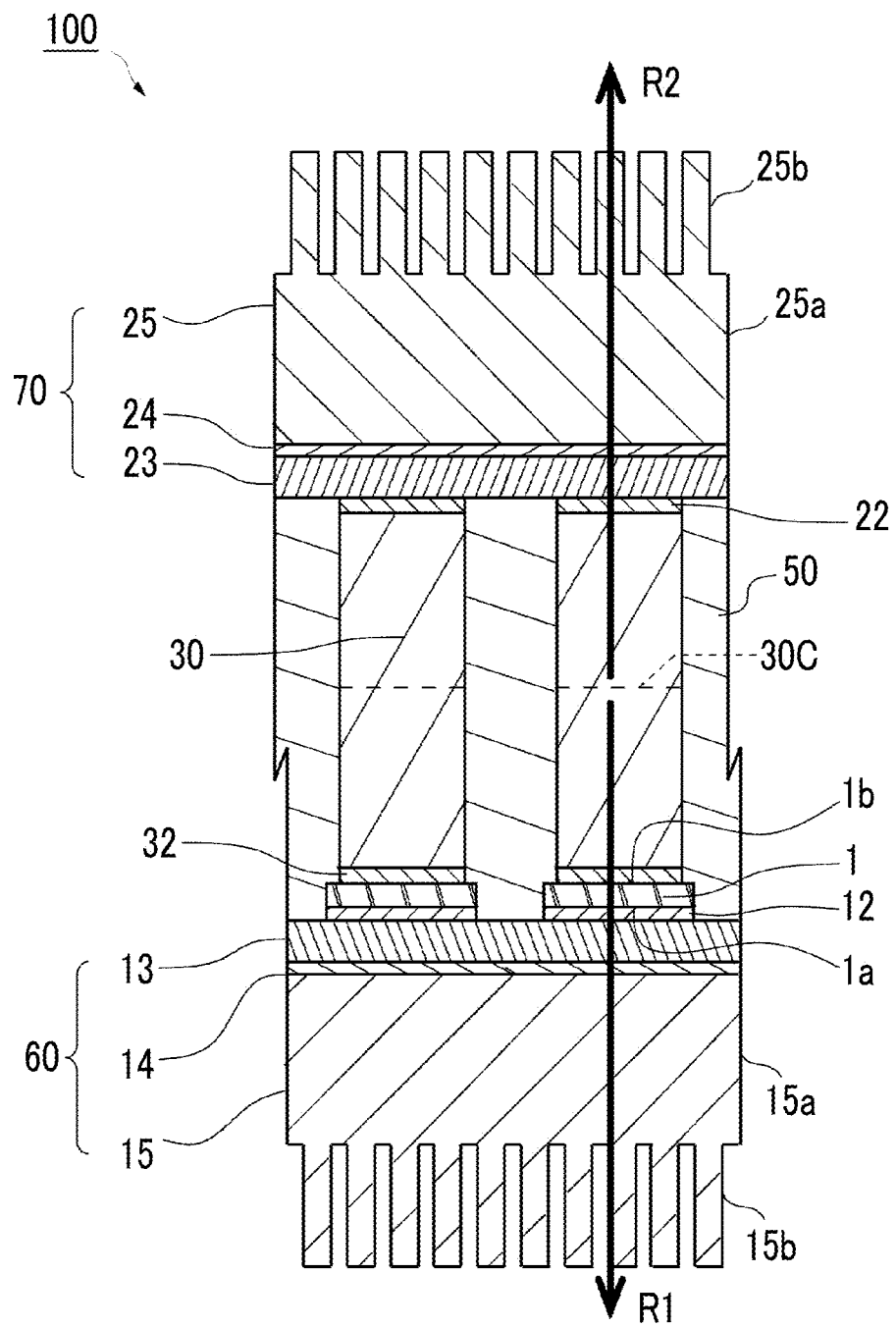
FIG. 8 is a cross-sectional view schematically showing the power module of the second embodiment, the diagram showing an enlarged view of a region in which a power semiconductor chip is provided.

A power module 100 according to the present embodiment will be described. FIG. 7 is a cross-sectional view schematically showing the power module 100 according to the embodiment of the present invention. FIG. 8 is an enlarged view showing a cross-sectional structure of the region of the power module 100 where the power semiconductor chip 1 is provided. In order to simplify the explanation, the positional relations (up-down relation and the like) of each constituent element of the power module 100 may be described as the relations shown in each drawing. However, the positional relations in this description are irrelevant to the positional relations at the time of use or production of the power module 100.

The power module 100 includes: a power semiconductor chip 1; a lead frame 6 for supporting and fixing the power semiconductor chip 1 and electrically connecting the power semiconductor chip 1 to an external wiring; a first heat dissipation structure 60 provided on one surface side (lower surface 1a side in the diagram) of the power semiconductor chip 1; a second heat dissipation structure 70 provided on the other surface side (here, upper surface 1b); a spacer 30 provided between the power semiconductor chip 1 and the second heat dissipation structure 70; and a sealing material layer 50 provided in a space between the first heat dissipation structure 60 and the second heat dissipation structure 70. In addition, the power module 100 includes a first joining layer 12 connecting the power semiconductor chip 1 or the lead frame 6 and the first heat dissipation structure 60; a second joining layer 22 connecting the spacer 30 and the second heat dissipation structure 70; and a third joining layer 32 connecting the power semiconductor chip 1 and the spacer 30.

A specific description will be given below.

<Power Semiconductor Chip 1>

The power semiconductor chip 1 is, for example, an Insulated Gate Bipolar Transistor (IGBT), or a diode. An electrode pattern that is not shown in the diagram is formed on the upper surface of the power semiconductor chip 1, and a conductive pattern that is not shown in the diagram is formed on the lower surface 1a of the power semiconductor chip 1.

The lower surface 1a of the power semiconductor chip 1 is joined to the first heat dissipation structure 60, with the first joining layer 12 serving as a joining layer interposed therebetween. The electrode pattern on the upper surface 1b of the power semiconductor chip 1 is electrically connected to the lead frame 6.

<Lead Frame 6>

The lead frame 6 is a component that supports and fixes the power semiconductor chip 1 and provides electrical connection to external wiring, and is a component produced by subjecting a thin plate of a metal material such as copper or iron to press working, etching processing, or the like.

<First Heat Dissipation Structure 60>

As illustrated, the first heat dissipation structure 60 includes, from the power semiconductor chip 1 side, a first Cu circuit 13 (also referred to as a "first metal circuit board"), a first heat dissipation sheet 14, and a first heat sink 15 (also referred to as "first heat dissipation member").

<First Cu Circuit 13>

The first Cu circuit 13 is a metal circuit board constructed from a metal material having conductivity. The power semiconductor chip 1 is provided on a circuit pattern formed on one surface (upper surface in the diagram) of the first Cu circuit 13, with the first joining layer 12 interposed therebetween.

The first Cu circuit 13 is a circuit board obtained by patterning thick copper (rolled copper). Regarding the metal material constituting the first Cu circuit 13, for example, thick copper (rolled copper) can be suitably used. As a result, the first Cu circuit 13 has a relatively small resistance value. At least a portion of the first Cu circuit 13 may be covered with a solder resist layer.

For example, the first Cu circuit 13 is formed by processing a metal layer (thick copper or the like), which is laminated on the upper surface of the base part 15a of the first heat sink 15 (Cu base plate), with the first heat dissipation sheet 14 interposed therebetween, into a predetermined pattern by cutting and etching, or is stuck to the first Cu circuit 13 by the first heat dissipation sheet 14 in a state of being processed in advance into a predetermined pattern.

The lower limit value of the thickness of the first Cu circuit 13 is, for example, equal to or more than 0.3 mm. When the thickness is equal to or more than such a numerical value, heat generation of the first Cu circuit 13 can be suppressed even in a use application where a high current is required. Furthermore, the upper limit value of the thickness of the first Cu circuit 13 is, for example, equal to or less than 5.0 mm, preferably equal to or less than 4.0 mm, and more preferably equal to or less than 3.0 mm. When the thickness is equal to or less than such a numerical value, the circuit processability can be improved, and thickness reduction of the product as a whole can be promoted.

<First Heat Dissipation Sheet 14>

The first heat dissipation sheet 14 is disposed between the first Cu circuit 13 and the first heat sink 15 (Cu base plate). The heat of the power semiconductor chip 1 is received at the first Cu circuit 13 and is further transferred through the first heat dissipation sheet 14 to the first heat sink 15 (Cu base plate), which is a heat dissipation unit. As a result, the heat (particularly the heat generated from the lower surface 1a side) generated from the power semiconductor chip 1, which is a heating element, can be effectively dissipated to the outside of the power module 100 while maintaining the insulation properties of the power module 100. Therefore, it is possible to improve the insulation reliability of the semiconductor device.

The planar shape of the first heat dissipation sheet 14 is not particularly limited and can be appropriately selected according to the shape of the first Cu circuit 13 or the first heat sink 15; however, for example, the planar shape can be a rectangular shape. The film thickness of the first heat dissipation sheet 14 is, for example, equal to or more than 50 μm and equal to or less than 250 μm. As a result, the heat of the first Cu circuit 13 can be more effectively transferred to the first heat sink 15 while promoting improvement in the mechanical strength and thermal resistance. Furthermore, the first heat dissipation sheet 14 has an excellent balance between heat dissipation properties and insulation properties. The thermal conductivity of the first heat dissipation sheet 14 is not particularly limited; however, a heat dissipation sheet having a thermal conductivity of preferably equal to or higher than 10 W/mK (175° C.), and more preferably equal to or higher than 15 W/mK (175° C.), is used.

[Material of First Heat Dissipation Sheet 14]

The first heat dissipation sheet 14 is, for example, a resin sheet and is formed by using a resin composition for a sheet. In the present embodiment, the resin composition for a sheet described in the first embodiment can be used as the resin composition for a sheet, and further description thereof will not be repeated here.

<First Heat Sink 15>

The first heat sink 15 is a type of heat dissipation member also referred to as a Cu base plate and has a plate-shaped base part 15a made of copper and a plurality of fin parts 15B integrally extending from the lower surface of the base part 15a.

Apart from the Cu base plate, for example, an aluminum base plate may be employed as the first heat sink 15. Furthermore, the heat dissipation member is not limited to a general heat dissipation member as long as it has a function of acquiring the heat generated by the power semiconductor chip 1 through the first Cu circuit 13 and then releasing the heat elsewhere, and the heat dissipation member may be a part of another configuration (for example, a housing), or the like. Even in that case, the first heat dissipation sheet 14 can be used.

<First Joining Layer 12>

The first joining layer 12 is a joining layer formed by sintering a sintering paste containing metal particles. Regarding the sintering paste, any one of an Ag sintering paste containing silver particles, an AL sintering paste containing aluminum particles, and a Cu sintering paste containing copper particles can be used.

A sintering paste such as described above is provided between the power semiconductor chip 1 and the first Cu circuit 13 and laminated, and as a result of a sintering step, the power semiconductor chip 1 and the first Cu circuit 13 are joined by the first joining layer 12. The first Cu circuit 13 and the lead frame 6 are joined by the first joining layer 12.

In the first joining layer 12, a sintering network based on metal particles (metal bond bath) is formed, and high thermal conductivity and low electrical resistance are realized. From the viewpoint of improving the joining properties provided by the first joining layer 12, the first Cu circuit 13 and the lead frame 6 may be subjected to a surface treatment by plating with the metal contained in the sintering paste. Specifically, in the present embodiment, the surfaces of the first Cu circuit 13 and the lead frame 6 may be subjected to Ag plating.

<Second Heat Dissipation Structure 70>

As illustrated, the second heat dissipation structure 70 includes, from the power semiconductor chip 1 side (that is, the spacer 30 side), a second Cu circuit 23 (also referred to as a "second metal circuit board"), a second heat dissipation sheet 24, and a second heat sink 25 (also referred to as a "second heat dissipation member").

<Second Cu circuit 23>

Similarly to the first Cu circuit 13, the second Cu circuit 23 is a metal circuit board constructed from a metal material having conductivity. The circuit pattern formed on one surface (lower surface in the diagram) of the second Cu circuit 23 is joined to a spacer 30, with the second joining layer 22 interposed therebetween. Furthermore, in a region where the spacer 30 is not provided, the circuit pattern is joined to the sealing material layer 50.

The second Cu circuit 23 may be a circuit board obtained by patterning thick copper (rolled copper) or may have a configuration in which thick copper is used as it is without patterning. Regarding the metal material constituting the second Cu circuit 23, for example, thick copper (rolled copper) can be suitably used. As a result, the second Cu circuit 23 has a relatively small resistance value. At least a portion of the second Cu circuit 23 may be covered with a solder resist layer.

For example, the second Cu circuit 23 is formed by processing a metal layer (thick copper or the like), which is laminated on the lower surface of the base part 25a of the second heat sink 25 (Cu base plate), with the second heat dissipation sheet 24 interposed therebetween, into a predetermined pattern by cutting and etching, or is stuck to the second Cu circuit 23 by the second heat dissipation sheet 24 in a state of being processed in advance into a predetermined pattern.

The lower limit value of the thickness of the second Cu circuit 23 is, for example, equal to or more than 0.3 mm. When the thickness is equal to or more than such a numerical value, heat generation of the second Cu circuit 23 can be suppressed even in a use application where a high current is required. Furthermore, the upper limit value of the thickness of the second Cu circuit 23 is, for example, equal to or less than 5.0 mm, preferably equal to or less than 4.0 mm, and more preferably equal to or less than 3.0 mm. When the thickness is equal to or less than such a numerical value, the circuit processability can be improved, and thickness reduction of the product as a whole can be promoted.

<Second Heat Dissipation Sheet 24>

The second heat dissipation sheet 24 is disposed between the second Cu circuit 23 and the second heat sink 25 (Cu base plate). The heat of the power semiconductor chip 1 is received at the second Cu circuit 23 through the spacer 30 and is further transferred through the second heat dissipation sheet 24 to the second heat sink 25, which is a heat dissipation unit. As a result, the heat (particularly, heat generated from the upper surface 1b side) generated from the power semiconductor chip 1, which is a heating element, can be effectively dissipated to the outside of the power module 100 while maintaining the insulation properties of the power module 100. Therefore, it is possible to improve the insulation reliability of the semiconductor device.

The shape and physical properties of the second heat dissipation sheet 24 are similar to those of the above-mentioned first heat dissipation sheet 14. That is, the planar shape of the second heat dissipation sheet 24 is not particularly limited and can be appropriately selected according to the shape of the second Cu circuit 23 or the second heat sink 25; however, for example, the planar shape can be a rectangular shape. The film thickness of the second heat dissipation sheet 24 is, for example, equal to or more than 50 μm and equal to or less than 250 μm. As a result, the heat of the second Cu circuit 23 can be more effectively transferred to the second heat sink 25 while promoting improvement in the mechanical strength and thermal resistance. In addition, the second heat dissipation sheet 24 has an excellent balance between heat dissipation properties and insulation properties. The thermal conductivity of the second heat dissipation sheet 24 is not particularly limited; however, a heat dissipation sheet having a thermal conductivity of preferably equal to or higher than 10 W/mK (175° C.), and more preferably equal to or higher than 15 W/mK (175° C.), is used.

Regarding the material of the second heat dissipation sheet 24, the material described as the material of the first heat dissipation sheet 14 can be used. The materials and the film thicknesses of the first heat dissipation sheet 14 and the second heat dissipation sheet 24 may be exactly the same or may be different within the above-described range.

<Second Heat Sink 25>

Similarly to the first heat sink 15, the second heat sink 25 is a type of heat dissipation member also referred to as a Cu base plate and includes a plate-shaped base part 25a made of copper and a plurality of fin parts 25b integrally extending from the upper surface of the base part 25a.

Apart from the Cu base plate, for example, an aluminum base plate may be employed as the second heat sink 25. Furthermore, the heat dissipation member is not limited to a general heat dissipation member as long as it has a function of acquiring the heat generated by the power semiconductor chip 1 through the spacer 30 and the second Cu circuit 23 and then releasing the heat elsewhere, and the heat dissipation member may be a part of another configuration (for example, a housing), or the like. Even in that case, the second heat dissipation sheet 24 can be used.

<Second Joining Layer 22>

Similarly to the first joining layer 12, the second joining layer 22 is a joining layer formed by sintering a sintering paste containing metal particles. Regarding the sintering paste, any one of an Ag sintering paste containing silver particles, an AL sintering paste containing aluminum particles, and a Cu sintering paste containing copper particles can be used.

A sintering paste such as described above is provided between the spacer 30 and the second Cu circuit 23 and laminated, and as a result of a sintering step, the spacer 30 and the second Cu circuit 23 are joined by the second joining layer 22.

<Spacer 30>

The spacer 30 adjusts the distance between the power semiconductor chip 1 and the second heat dissipation structure 70 disposed on the upper side of the power semiconductor chip 1 to a predetermined length. The spacer 30 is, for example, made of a metal, and specifically, the metal is copper (including a copper alloy), aluminum (including an aluminum alloy), or the like. The upper side of the spacer 30 is joined to the second Cu circuit 23 of the second heat dissipation structure 70, with the second joining layer 22 interposed therebetween. Furthermore, the lower side of the spacer 30 is joined to the power semiconductor chip 1, with a third joining layer 32, which will be described later, interposed therebetween.

The heat dissipation characteristics in the upward direction of the power semiconductor chip 1 can be adjusted by the spacer 30. Furthermore, when forming a sealing material layer 50 that seals the power semiconductor chip 1, the lead frame 6, and the like, the flow of the sealing material can be appropriately adjusted.

<Third Joining Layer 32>

Similarly to the first joining layer 12 and the second joining layer 22, a third joining layer 32 is a joining layer formed by sintering a sintering paste containing metal particles. Regarding the sintering paste, anyone of an Ag sintering paste containing silver particles, an AL sintering paste containing aluminum particles, and a Cu sintering paste containing copper particles can be used.

A sintering paste such as described above is provided between the spacer 30 and the power semiconductor chip 1 and laminated, and as a result of a sintering step, the spacer 30 and the power semiconductor chip 1 are joined by the third joining layer 32.

<Sealing Material Layer 50>

The sealing material layer 50 is, for example, a molding resin and internally integrally seals the constituent elements between the first heat dissipation structure 60 and the second heat dissipation structure 70, such as the power semiconductor chip 1 and the spacer 30. Apart from the molding resin, silicone gel or the like may be used as the sealing material used for the sealing material layer 50. In the following description, a configuration that is integrally sealed with a molding resin will be described.

In this sealing, a portion of the lead frame 6 is sealed, and the other portion that is not sealed is connected to an external device. With regard to the first heat sink 15, the upper surface and side surfaces of the base part 15a of the first heat sink 15 are covered and sealed with the sealing material layer 50. The lower surface of the first heat sink 15 and the fin parts 15B are not covered with the sealing material layer 50. That is, the sealing material layer 50 covers and seals the power semiconductor chip 1 so as to cover a portion or the entirety of the side surfaces in the thickness direction of the base part 15a of the first heat sink 15. Here, a configuration in which all the side surfaces of the base part 15a of the first heat sink 15 are covered with the sealing material layer 50 is illustrated. By adopting a configuration in which a portion or the entirety of the first heat sink 15 is covered with the sealing material layer 50, it is easy to achieve a balance between the strength and heat dissipation properties of the power module 100.

[Components of Sealing Material Layer 50 (Molding Resin)]

As the molding resin of the sealing material layer 50, the same molding resin as that of the sealing material 7 of the first embodiment can be used, and further description thereof will not be repeated here.

<Thermal Resistance of Laminated Structure of Power Module 100>

The thermal resistance of the laminated structure of the power module 100 will be described. In the following description, the relation between a first thermal resistance (R1) in the direction of lamination from the center 30C in the thickness direction of the spacer 30 to the first heat dissipation structure 60, and a second thermal resistance (R2) in the direction of lamination to the second heat dissipation structure 70 will be described.

The ratio R1/R2 between the first thermal resistance R1 in the direction of lamination from the center 30C in the thickness direction of the spacer 30 to the first heat dissipation structure 60, and the second thermal resistance R2 in the direction of lamination from the center 30C in the thickness direction of the spacer 30 to the second heat dissipation structure 70 is equal to or more than 0.7 and equal to or less than 1.3, preferably equal to or more than 0.8 and equal to or less than 1.2, and more preferably equal to or more than 0.9 and equal to or less than 1.1.

Furthermore, the first thermal resistance R1 and the second thermal resistance R2 are equal to or more than 0.05 K/W and equal to or less than 0.5 K/W, preferably equal to or more than 0.06 K/W and equal to or less than 0.45 K/W, and more preferably equal to or more than 0.07 K/W and equal to or less than 0.40 K/W.

Here, the first thermal resistance R1 is sum (R11+R12+R13+R14+R15) of the thermal resistance R11 in the lower half of the thickness direction of the spacer 30, the thermal resistance R12 of the third joining layer 32, the thermal resistance R13 of the power semiconductor chip 1, the thermal resistance R14 of the first joining layer 12, and the thermal resistance R15 of the first heat dissipation structure 60. The thermal resistance R15 of the first heat dissipation structure 60 is the sum (R16+R17+R18) of the thermal resistance R16 of the first Cu circuit 13, the thermal resistance R17 of the first heat dissipation sheet 14, and the thermal resistance R18 of the first heat sink 15.

The second thermal resistance R2 is the sum (R21+R22+R23) of the thermal resistance R21 in the upper half of the thickness direction of the spacer 30, the thermal resistance R22 of the second joining layer 22, and the thermal resistance R23 of the second heat dissipation structure 70. The thermal resistance R23 of the second heat dissipation structure 70 is the sum (R24+R25+R26) of the thermal resistance R24 of the second Cu circuit 23, the thermal resistance R25 of the second heat dissipation sheet 24, and the thermal resistance R26 of the second heat sink 25.

When the ratio (R1/R2) is within the above-described range, it is easy to adjust the thermal resistance in the thickness direction of the power module 100. Furthermore, when the first thermal resistance R1 and the second thermal resistance R2 are within the above-described ranges, the heat generated in the power semiconductor chip 1 can be rapidly released to the outside.

<Features and Effects of Power Module 100>

The features and effects of the present embodiment are summarized as follows.

(1) The power module 100 of the present embodiment includes:
a power semiconductor chip 1;
a first heat dissipation structure 60 provided on one surface side (lower surface 1a side in the diagram) of the power semiconductor chip 1;
a second heat dissipation structure 70 provided on the other surface side (upper surface 1b side in the diagram) of the power semiconductor chip 1;
a first joining layer 12 for joining the power semiconductor chip 1 and the first heat dissipation structure 60 by using a sintering paste;
a spacer 30 provided between the power semiconductor chip 1 and the second heat dissipation structure 70;
a second joining layer 22 for joining the second heat dissipation structure 70 and the spacer 30 by using a sintering paste;
a third joining layer 32 for joining the power semiconductor chip 1 and the spacer 30 by using a sintering paste; and
a sealing material layer 50 in which in a region between the first heat dissipation structure 60 and the second heat dissipation structure 70, a region where the power semiconductor chip 1, the spacer 30, and the first to third joining layers 12, 22, and 32 are not provided is sealed with a mold sealing material.

With such a configuration, satisfactory heat dissipation performance of the power module 100 can be obtained. Specifically, for the joining of the power semiconductor chip 1 and the first joining layer 12 or the spacer 30, and for the joining of the spacer 30 and the second heat dissipation structure 70 (that is, the second Cu circuit 23), the first to third joining layers 12, 22, and 32 in which a sintering paste was used instead of solder were used. Since the sintering layer (sintering paste) has a high thermal conductivity, the heat generated by the power semiconductor chip 1 can be effectively released to the outside.

Furthermore, by providing the spacer 30 between the upper surface 1b of the power semiconductor chip 1 and the second heat dissipation structure 70, the heat dissipation characteristics in the upward direction of the power semiconductor chip 1 can be adjusted. Furthermore, when forming a sealing material layer 50 that seals the power semiconductor chip 1, the lead frame 6, and the like, the flow of the sealing material can be appropriately adjusted.

Furthermore, by using a molding resin for the sealing material layer 50, it is much easier to cope with size reduction and thickness reduction for the power module having the power semiconductor chip 1.

(2) The first heat dissipation structure 60 includes:
a first metal circuit board (first Cu circuit 13) joined to one surface of the first joining layer 12; and
a first heat dissipation sheet 14 provided on the other surface of the first metal circuit board (first Cu circuit 13) and provided for joining the first heat sink 15.

By adopting such a configuration, the heat generated by the power semiconductor chip 1 can be effectively released to the outside (particularly, from the lower side direction in the diagram). As a result, the maximum temperature in the power semiconductor chip 1 can be lowered, and improvement in electrical characteristics can be realized. Furthermore, as the heat dissipation properties are improved, thermal stress in continued use is reduced, and the reliability of joint parts such as those of the first joining layer 12 and the first heat dissipation sheet 14 is improved.

(3) The first heat dissipation structure 60 includes the first heat sink 15.

(4) The second heat dissipation structure 70 includes:
a second metal circuit board (second Cu circuit 23) joined to one surface of the second joining layer 22; and
a second heat dissipation sheet 24 provided on the other surface of the second metal circuit board (second Cu circuit 23) and provided for joining the second heat sink 25.

By adopting such a configuration, the heat generated by the power semiconductor chip 1 can be effectively released to the outside (particularly from the upward direction in the diagram). As a result, the maximum temperature in the power semiconductor chip 1 can be lowered, and improvement in electrical characteristics can be realized. Furthermore, as the heat dissipation properties are improved, thermal stress in continued use is reduced, and the reliability of joint parts such as those of the second joining layer 22 and the second heat dissipation sheet 24 is improved.

(5) The second heat dissipation structure 70 includes the second heat sink 25.

(6) A ratio R1/R2 between the first thermal resistance R1 in the direction of lamination from the center 30C in the thickness direction of the spacer 30 to the first heat dissipation structure 60, and the second thermal resistance R2 in the direction of lamination from the center 30C in the thickness direction of the spacer 30 to the second heat dissipation structure 70, is equal to or more than 0.7 and equal to or less than 1.3. When the ratio (R1/R2) is within the above-described range, it is easy to adjust the thermal resistance in the thickness direction of the power module 100.

(7) The first thermal resistance R1 and the second thermal resistance R2 are equal to or more than 0.05 (K/W) and equal to or less than 0.5 (K/W).

When the first thermal resistance R1 and the second thermal resistance R2 are within the above-described ranges, the heat generated in the power semiconductor chip 1 can be rapidly released to the outside.

Thus, the embodiments of the present invention have been described above; however, these are only examples of the present invention, and various configurations other than the above-described ones can be adopted. Furthermore, it should be noted that the present invention is not intended to be limited to the above-described embodiments, and modifications, ameliorations, and the like made to the extent that the object of the present invention can be achieved are included in the present invention.

Summary of Features of First and Second Embodiments

The features of the first and second embodiments are summarized below.
(1) The power module of the present invention includes:
a power semiconductor element; and
a first heat dissipation structure having the power semiconductor element provided on one surface side,
in which the first heat dissipation structure includes
a first metal circuit board,
a first joining layer provided for joining the power semiconductor element to one surface of the first metal circuit board by using a sintering paste, and
a first heat dissipation sheet provided for joining a first heat dissipation member to the other surface of the first metal circuit board, and
in a laminated structure A in which the power semiconductor element, the first joining layer, the first metal circuit board, and the first heat dissipation sheet are laminated, the total thermal resistance in the direction of lamination is equal to or less than 0.30 (K/W).
(2) The first heat dissipation structure further includes a first heat dissipation member joined to the other surface of the first metal circuit board by the first heat dissipation sheet.
(3) In a laminated structure B in which the power semiconductor element, the first joining layer, the first metal circuit board, the first heat dissipation sheet, and the first heat dissipation member are laminated, the total thermal resistance in the direction of lamination (height direction) is equal to or less than 0.45 (K/W).
(4) When the total thermal resistance in the direction of lamination of the laminated structure A is designated as XA (K/W), and the total thickness of the laminated structure A is designated as tA (mm), the ratio XA/tA is equal to or less than 0.25 (K/(W·mm)).
(5) When the total thermal resistance in the direction of lamination of the laminated structure B is designated as XB (K/W), and the total thickness of the laminated structure B is designated as tB (mm), the ratio XB/tB is equal to or less than 0.08 (K/(W·mm)).
(6) A second heat dissipation structure provided on the other surface side of the power semiconductor element; and a spacer provided between the power semiconductor element and the second heat dissipation structure, are further included, and
the second heat dissipation structure includes a second metal circuit board and a second joining layer provided for joining the spacer to one surface of the second metal circuit board by using a sintering paste, and
includes a third joining layer for joining the power semiconductor element and the spacer by using a sintering paste, and
a sealing material layer in a region between the first heat dissipation structure and the second heat dissipation structure, a region where the power semiconductor element, the spacer, and the first to third joining layers are not provided is sealed with a mold sealing material.
(7) The second heat dissipation structure further includes a second heat dissipation sheet provided for joining a second heat dissipation member to the other surface of the second metal circuit board.
(8) The second heat dissipation structure further includes a second heat dissipation member joined to the other surface of the second metal circuit board by the second heat dissipation sheet.
(9) A ratio R1/R2 between a first thermal resistance R1 in the direction of lamination from the center in the thickness direction of the spacer to the first heat dissipation structure, and a second thermal resistance R2 in the direction of lamination from the center in the thickness direction of the spacer to the second heat dissipation structure is equal to or more than 0.7 and equal to or less than 1.3.
(10) The first thermal resistance R1 and the second thermal resistance R2 are equal to or more than 0.05 (K/W) and equal to or less than 0.5 (K/W).
(11) Metal particles contained in the sintering paste are any of silver particles, aluminum particles, or copper particles.
(12) A sealing material that covers the power semiconductor element is further included.
(13) The sealing material is formed of a molding resin.
(14) The sealing material covers and seals the power semiconductor element so as to cover a portion or the entirety of side surfaces in the thickness direction of the first heat dissipation member and/or the second heat dissipation member.
(15) The first metal circuit board and/or the second metal circuit board is a circuit board obtained by patterning thick copper (rolled copper) and has a thickness of equal to or more than 0.3 mm and equal to or less than 5 mm.

EXAMPLES

Embodiments of the present invention will be described in detail based on Examples. In addition, the present invention is not intended to be limited to the Examples. In the following description, the first and second Examples correspond to the first embodiment, and the third Example corresponds to the second embodiment.

First Example

Table 1 shows the thermal conductivities of the above-described first and second laminated structure examples (Example 1 and Example 2) together with the thermal conductivity of Comparative Example. In Example 1 and Example 2, the thickness t of the configuration corresponding to the Cu circuit 3 is different, while the other conditions are the same. Among the constituent elements in the table, an element corresponding to the first laminated structure is a laminated structure based on "chip, sintering, circuit, heat dissipation sheet". An element corresponding to the second laminated structure is a laminated structure based on "chip, sintering, circuit, heat dissipation sheet, base substrate". As the heat dissipation sheet, a resin sheet having a thermal conductivity of 18 W among the resin sheets of the heat dissipation sheet 14 described in the above-described embodiment was applied.

The total thermal resistances Rth_sum (corresponding to XA (K/W) of the embodiment) in the direction of lamination of the first laminated structures in Examples 1 and 2 are 0.119 (K/W) and 0.168 (K/W), respectively, that is, equal to or less than 0.30 (K/W). On the other hand, in the Comparative Example, the configuration excluding the base substrate (corresponding to the first laminated structure) is 0.353 (K/W), that is, more than 0.30 (K/W).

The total thermal resistances Rth_sum (corresponding to XB (K/W) of the embodiment) in the direction of lamination of the second laminated structures in Examples 1 and 2 are 0.184 (K/W) and 0.233 (K/W), respectively, that is, equal to or less than 0.25 (K/W). On the other hand, in the configuration including the base substrate of the Comparative Example, the total thermal resistance is 0.473 (K/W), that is, more than 0.45 (K/W).

The ratios Rth_sum/t_sum (corresponding to the ratio XA/t in the embodiment) of the total thermal resistance Rth_sum (corresponding to XA (K/(W·mm)) in the embodiment) in the direction of lamination of the first laminated structure and the thickness t_sum in Examples 1 and 2 are 0.156 (K/(W·mm)) and 0.074 (K/(W·mm)), respectively, that is, equal to or less than 0.25 (K/W). On the other hand, in the Comparative Example, the configuration excluding the base substrate (corresponding to the first laminated structure) is 0.257 (K/(W·mm)), that is, more than 0.25 (K/(W·mm)).

The ratios Rth_sum/t_sum (corresponding to the ratio XB/tB in the embodiment) of the total thermal resistance Rth_sum (corresponding to XB (K/(W·mm)) in the embodiment) in the direction of lamination of the second laminated structure and the thickness t_sum in Examples 1 and 2 are 0.067 (K/(W·mm)) and 0.055 (K/(W·mm)), respectively, that is, equal to or less than 0.08 (K/W). On the other hand, in the Comparative Example, the ratio is 0.083 (K/(W·mm)), that is, more than 0.08 (K/(W·mm)).

Second Example

In the second Example, with regard to the power module 10 shown in the embodiment, a conventional structure (comparative example) and a simulation model were examined from the viewpoint of the heat dissipation properties of the power semiconductor chip 1.

<Simulation Model>

Figure 2:
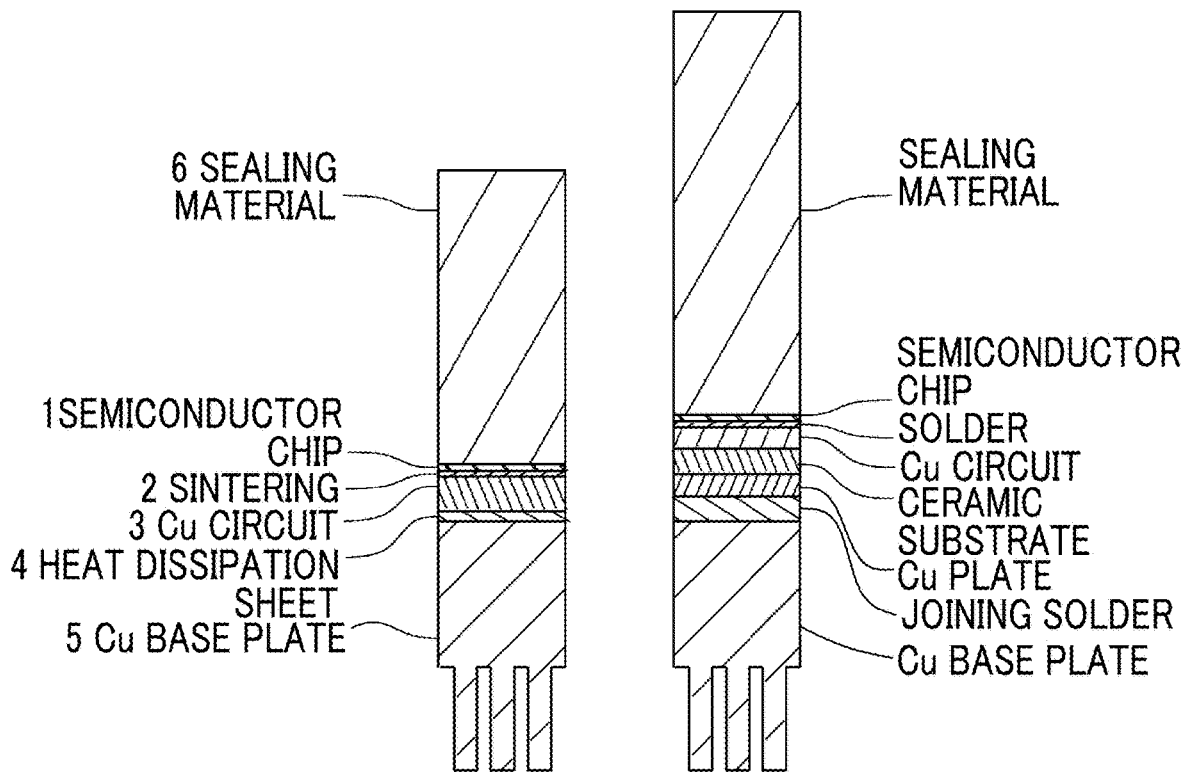
FIG. 2 is a cross-sectional view showing a structural example of power modules of Examples and Comparative Examples.

Simulation models of the Example and the Comparative Example are as follows, and a cross-sectional view of structural examples of the power modules of the Example and the Comparative Example is shown in FIG. 2.

(A) Example: Shown is a power module in which, from the lower side of the diagram, a Cu base plate, a heat dissipation sheet, a Cu circuit, a sintering layer, and a power semiconductor chip are laminated in this order, and this corresponds to the configuration of the power module 10 of the above-described embodiment.

(B) Comparative Example: Shown is a power module 10 in which, from the lower side of the diagram, a Cu base plate, joining solder, a Cu plate, a ceramic substrate, a Cu circuit, solder, a power semiconductor chip, and a sealing material are laminated in this order.

<Simulation Conditions>

A summary of the simulation conditions is as follows.

Figure 3:
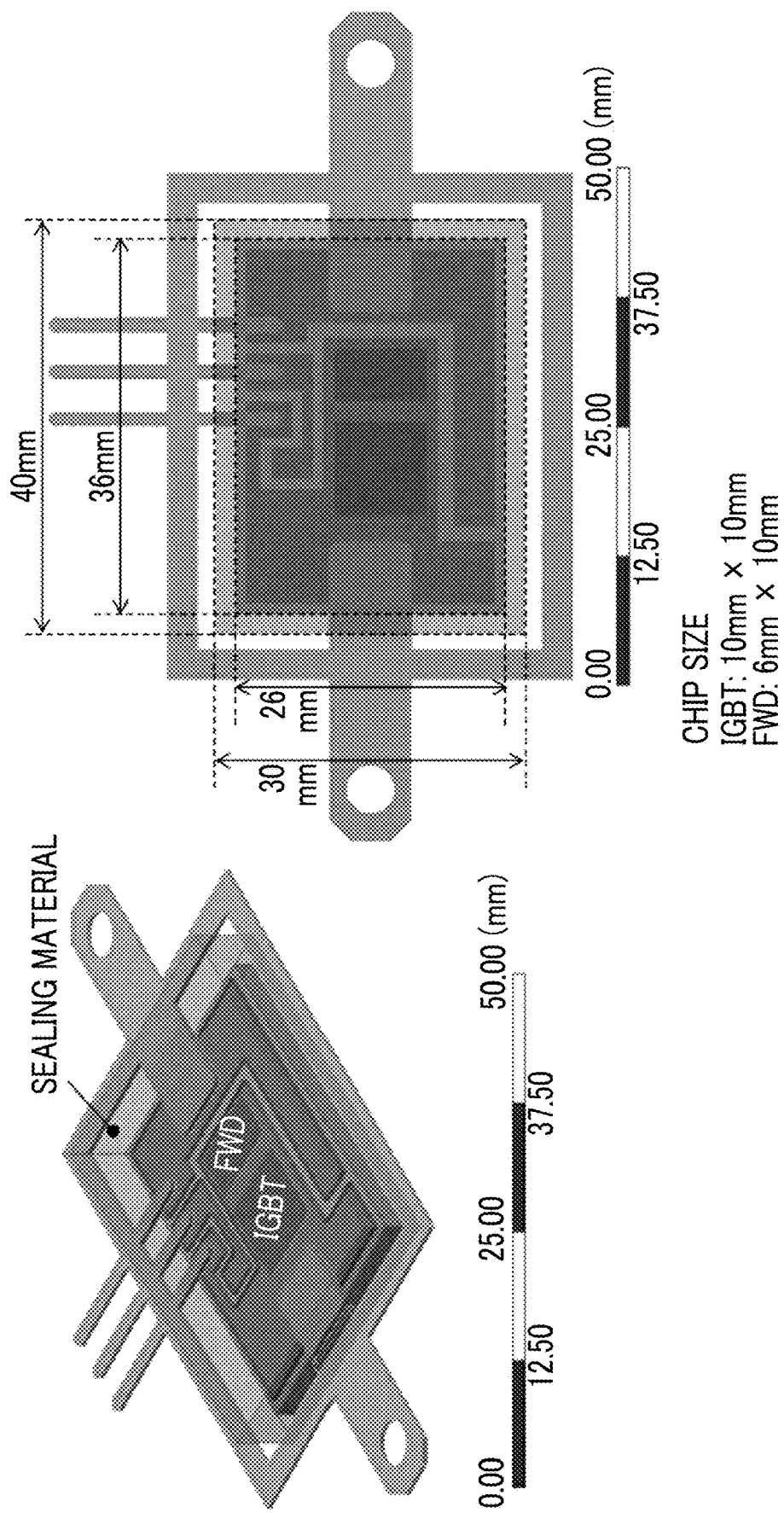
FIG. 3 is a diagram showing a model of the power modules of the Examples and Comparative Examples.
Figure 4:
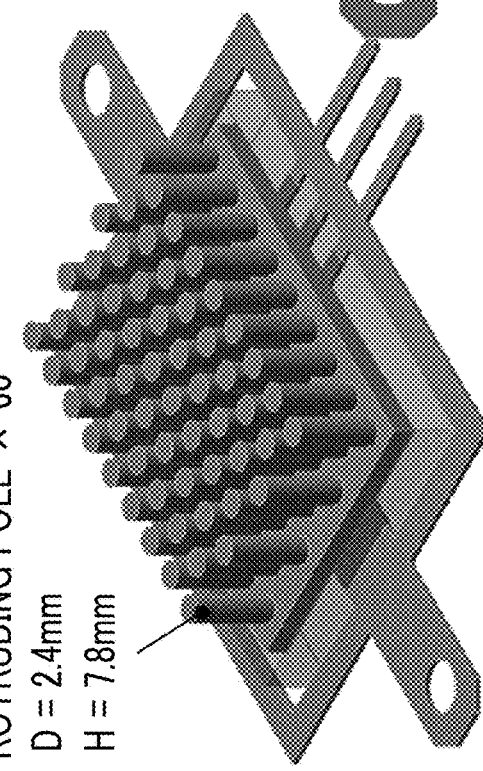
FIG. 4 is a diagram showing a model of the power modules of the Examples and Comparative Examples.
Figure 4:
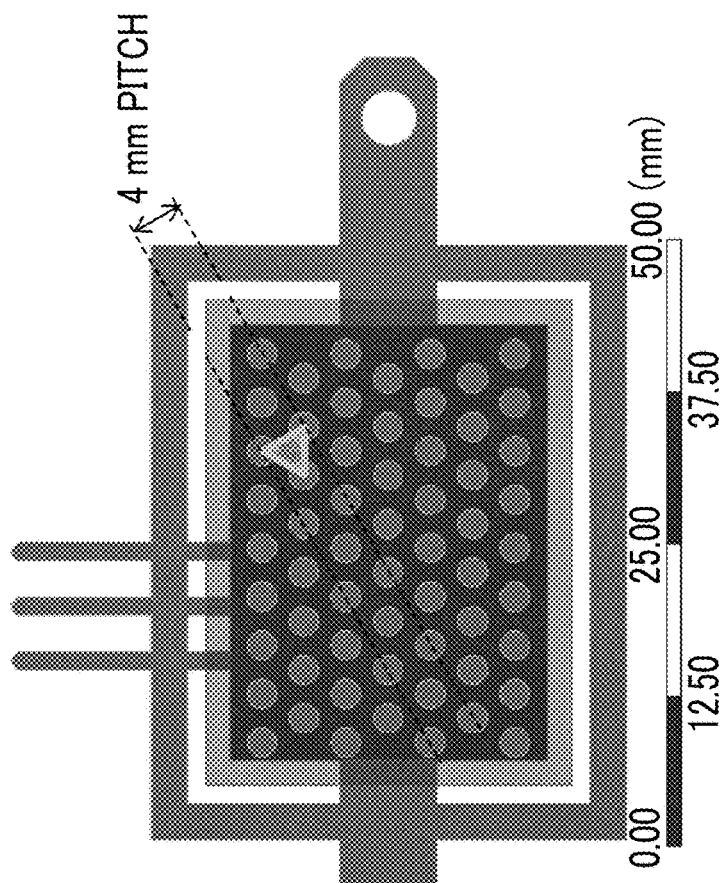
Figure 5:
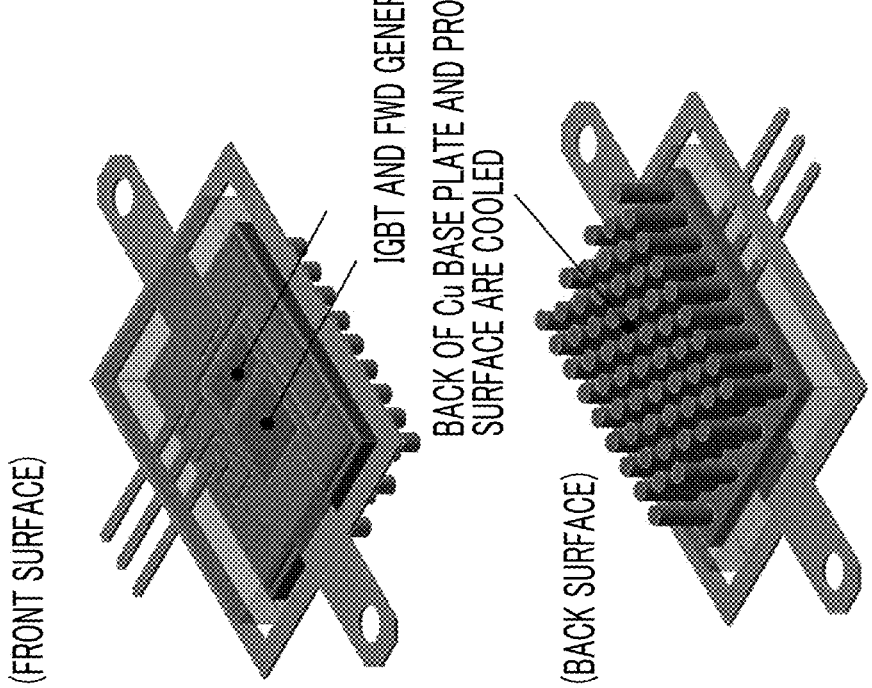
FIG. 5 is a diagram showing thermal conditions in a simulation of heat distribution in the Examples and Comparative Examples.

FIGS. 3 to 5 and Table 2 show the physical properties and dimension (thickness) of each constituent element of the Examples and Comparative Examples in the simulation. FIG. 3(a) is a perspective view of the power module as viewed from the upper side, and FIG. 3(b) is a plan view. FIG. 4(a) is a perspective view of the power module as viewed from the lower side, and FIG. 4(b) is a bottom view. FIG. 5 is a diagram showing the thermal conditions for the simulation (heat transfer analysis).

Simulation software: ANSYS Mechanical 2019R3

Power semiconductor chip: Equipped with IGBT and Free Wheeling Diode (FWD)

TABLE 1

| | | | Thermal conductivity [W/mK] | Thickness t [mm] | Total thickness t_sum [mm] | Rth [K/W] | Total Rth_sum [K/W] | Rth_sum/ t_sum |
|---|---|---|---|---|---|---|---|---|
| Example 1 | Chip | Si-IGBT | 168 | 0.090 | 0.090 | 0.00692 | 0.00692 | 0.0769 |
| | Sintering | Ag | 100 | 0.050 | 0.14 | 0.00646 | 0.01337 | 0.0955 |
| | Circuit | Cu | 398 | 0.500 | 0.64 | 0.01622 | 0.02960 | 0.0462 |
| | Heat dissipation sheet | Resin sheet | 18 | 0.125 | 0.765 | 0.08968 | 0.11927 | 0.1559 |
| | Base substrate | Cu | 398 | 2.000 | 2.765 | 0.06489 | 0.18416 | 0.0666 |
| Example 2 | Chip | Si-IGBT | 168 | 0.090 | 0.090 | 0.00692 | 0.00692 | 0.0769 |
| | Sintering | Ag | 100 | 0.050 | 0.140 | 0.00646 | 0.01337 | 0.0955 |
| | Circuit | Cu | 398 | 2.000 | 2.140 | 0.06489 | 0.07826 | 0.0366 |
| | Heat dissipation sheet | Resin sheet | 18 | 0.125 | 2.265 | 0.08968 | 0.16794 | 0.0741 |
| | Base substrate | Cu | 398 | 2.000 | 4.265 | 0.06489 | 0.23283 | 0.0546 |
| Comparative Example | Chip | Si-IGBT | 168 | 0.070 | 0.070 | 0.00463 | 0.00463 | 0.0661 |
| | Solder | Solder (5SnPb) | 29.4 | 0.035 | 0.105 | 0.01323 | 0.01786 | 0.1701 |
| | Circuit | Cu | 398 | 0.290 | 0.395 | 0.00810 | 0.02595 | 0.0657 |
| | Ceramic | Alumina | 20 | 0.330 | 0.725 | 0.18333 | 0.20929 | 0.2887 |
| | Base substrate | Cu | 398 | 0.290 | 1.015 | 0.00810 | 0.21738 | 0.2142 |
| | Solder | Solder (5SnPb) | 29.4 | 0.36 | 1.375 | 0.13605 | 0.35344 | 0.2570 |
| | Heat sink | Cu | 398 | 4.3 | 5.675 | 0.12004 | 0.47348 | 0.0834 |

Base substrate: Protruding poles were provided on a Cu base plate, and the back surface and the protruding pole surface of the Cu base plate were cooled with cooling water (65° C.).

TABLE 2

|  |  |  | Thermal conductivity [W/mK] | Thickness t [mm] |
|---|---|---|---|---|
| Example | Chip | Si-IGBT, FWD | 168 | 0.090 |
|  | Sintering | Ag | 100 | 0.050 |
|  | Circuit | Cu | 398 | 0.500 |
|  | Heat dissipation sheet | Resin sheet | 18 | 0.125 |
|  | Base plate | Cu | 398 | 2.000 |
| Comparative Example | Chip | Si-IGBT, FWD | 168 | 0.070 |
|  | Solder | Solder (5 SnPb) | 29.4 | 0.035 |
|  | Circuit | Cu | 398 | 0.290 |
|  | Ceramic | Alumina | 20 | 0.330 |
|  | Base substrate | Cu | 398 | 0.290 |
|  | Solder | Solder (5 SnPb) | 29.4 | 0.36 |
|  | Base plate | Cu | 398 | 4.3 |

<Simulation Results>

Figure 6:
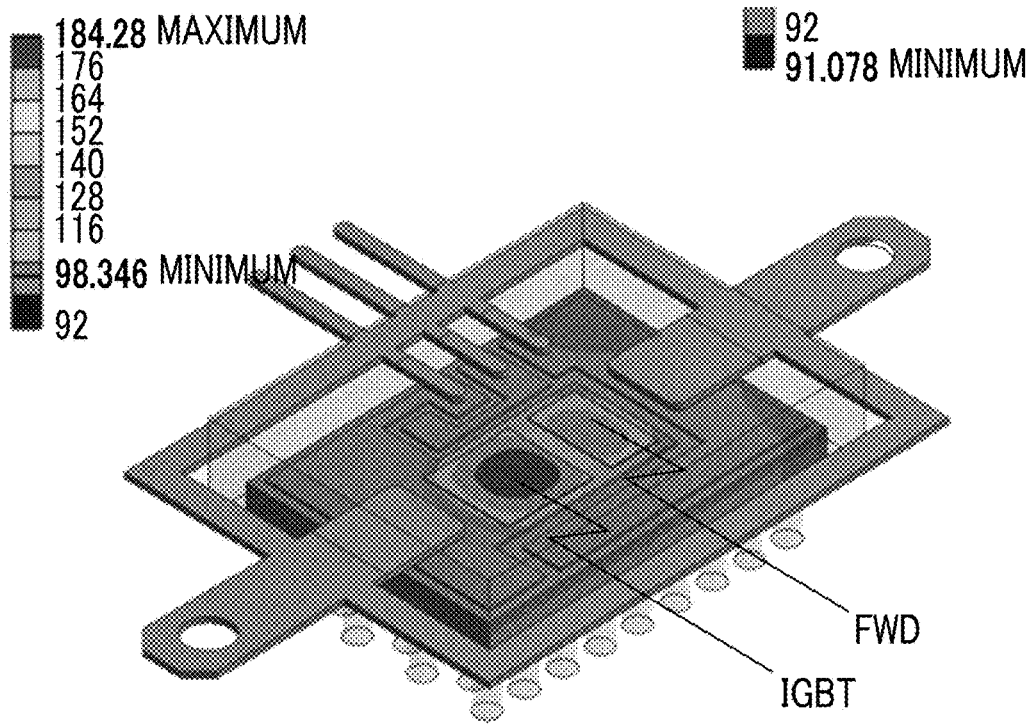
FIG. 6 is a diagram showing simulation results for the heat distribution in the Examples and Comparative Examples on a model of power module.
Figure 6:
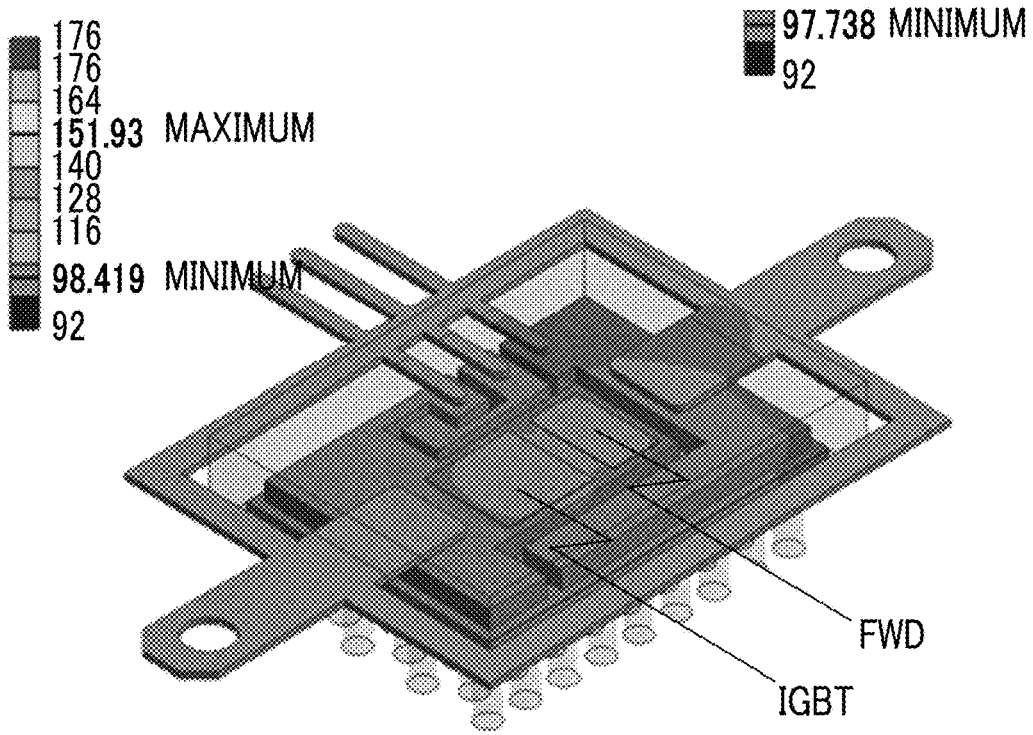

FIG. 6 shows heat distributions as the results of the simulation on the models of the power module.

In the Comparative Example, as shown in FIG. 6(a), the maximum surface temperature of the power semiconductor chip (here, IGBT) is 184° C. On the other hand, in the Example, as shown in FIG. 6(b), the maximum surface temperature of the power semiconductor chip (here, IGBT) was 152° C., which was a temperature lower by 32° C. than that in the Comparative Example.

Third Example

In the present Example, a simulation was performed in relation to the first thermal resistance R1, the second thermal resistance R2, and the ratio R1/R2. The simulation results are shown in Table 3.

The configuration of an embodiment corresponding to the first thermal resistance R1 is a configuration in which a spacer 30 (lower half), a power semiconductor chip 1 (Si-IGBT), a first joining layer 12 (sintering paste layer), a first Cu circuit 13, a first heat dissipation sheet 14, and a first heat sink 15 (Cu) are laminated. In the present Example, a simulation is performed with a configuration in which the third joining layer 32 is omitted.

The configuration of an embodiment corresponding to the second thermal resistance R2 is a configuration in which a spacer 30 (upper half), a second joining layer 22 (sintering paste layer), a second Cu circuit 23, a second heat dissipation sheet 24, and a second heat sink 25 (Cu) are laminated.

The thermal conductivity, thickness, and the like of each constituent member are as shown in the tables.

The results of this simulation were as follows.
First thermal resistance R1=0.31 [K/W]
Second thermal resistance R2=0.30 [K/W]
Ratio R1/R2=1.023

That is, the first thermal resistance R1 and the second thermal resistance R2 were in the range of equal to or more than 0.05 (K/W) and equal to or less than 0.5 (K/W). The ratio R1/R2 was equal to or more than 0.7 and equal to or less than 1.3.

TABLE 3

| Constituent member | Material | Thermal conductivity [W/mK] | Thickness of each part [mm] | Total thickness t [mm] | Thermal resistance R of each part [K/W] | Total thermal resistance Rth [K/W] |
|---|---|---|---|---|---|---|
| R1 | | | | | | |
| Spacer (lower 1/2) | Cu | 398 | 1.5 | 1.5 | 0.048668 | 0.05 |
| Power semiconductor chip | Si-IGBT | 168 | 0.090 | 1.590 | 0.006918 | 0.06 |
| First joining layer | Sintering | 100 | 0.050 | 1.640 | 0.006457 | 0.06 |
| First Cu circuit | Cu | 398 | 0.500 | 2.140 | 0.016223 | 0.08 |
| First heat dissipation sheet | | 18 | 0.125 | 2.265 | 0.089675 | 0.17 |
| First heat dissipation plate | Cu | 398 | 4.300 | 6.565 | 0.139515 | 0.31 |
| R2 | | | | | | |
| Spacer (upper 1/2) | Cu | 398 | 1.5 | 1.5 | 0.048668 | 0.05 |
| Second joining layer | Sintering | 100 | 0.050 | 1.550 | 0.006457 | 0.06 |
| Second Cu circuit | Cu | 398 | 0.500 | 2.050 | 0.016223 | 0.07 |
| Second heat dissipation sheet | | 18 | 0.125 | 2.175 | 0.089675 | 0.16 |
| Second heat dissipation plate | Cu | 398 | 4.300 | 6.475 | 0.139515 | 0.30 |

This application claims priority based on Japanese Patent Application No. 2020-124566 filed Jul. 21, 2020, and Japanese Patent Application No. 2021-010158 filed Jan. 26, 2021, the entire disclosures of which are incorporated herein by reference.

REFERENCE SIGNS LIST 1 power semiconductor chip (power semiconductor element)
2 sintering layer (first joining layer)
3 Cu circuit (first metal circuit board)
4 heat dissipation sheet (first heat dissipation sheet)
5 Cu base plate (first heat dissipation member)
6 lead frame
7 sealing material
10, 100 power module
12 first joining layer
13 first Cu circuit (first metal circuit board)
14 first heat dissipation sheet
15 first heat sink (first heat dissipation member)
22 second joining layer
23 second Cu circuit (second metal circuit board)
24 second heat dissipation sheet
25 second heat sink (second heat dissipation member)
30 spacer
30C center of spacer
32 third joining layer
50 sealing material layer
60 first heat dissipation structure
70 second heat dissipation structure
100 power module

The invention claimed is:

1. A power module comprising:
a power semiconductor element; and
a first heat dissipation structure having the power semiconductor element provided on one surface side,
wherein the first heat dissipation structure includes
a first metal circuit board,
a first joining layer provided for joining the power semiconductor element to one surface of the first metal circuit board by using a sintering paste, and
a first heat dissipation sheet provided for joining a first heat dissipation member to the other surface of the first metal circuit board, and
wherein in a laminated structure A in which the power semiconductor element, the first joining layer, the first metal circuit board, and the first heat dissipation sheet are laminated, a total thermal resistance in a direction of lamination is equal to or less than 0.30 (K/W),
wherein the first heat dissipation sheet is formed by using a resin composition for a sheet, and
wherein the resin composition for the sheet includes a thermosetting resin (A), a filler (B) and a curing agent (C).

2. The power module according to claim 1,
wherein the first heat dissipation structure further includes the first heat dissipation member joined to the other surface of the first metal circuit board by using the first heat dissipation sheet.

3. The power module according to claim 2,
wherein in a laminated structure B in which the power semiconductor element, the first joining layer, the first metal circuit board, the first heat dissipation sheet, and the first heat dissipation member are laminated, a total thermal resistance in a direction of lamination (height direction) is equal to or less than 0.45 (K/W).

4. The power module according to claim 1,
wherein when the total thermal resistance in the direction of lamination of the laminated structure A is designated as XA (K/W) and a total thickness of the laminated structure A is designated as tA (mm), a ratio XA/tA is equal to or less than 0.25 (K/W·(mm)).

5. The power module according to claim 3,
wherein when the total thermal resistance in the direction of lamination of the laminated structure B is designated as XB (K/W) and a total thickness of the laminated structure B is designated as tB (mm), a ratio XB/tB is equal to or less than 0.08 (K/W·(mm)).

6. The power module according to claim 1, further comprising:
a second heat dissipation structure provided on the other surface side of the power semiconductor element; and
a spacer provided between the power semiconductor element and the second heat dissipation structure,
wherein the second heat dissipation structure includes
a second metal circuit board, and
a second joining layer provided for joining the spacer to one surface of the second metal circuit board by using a sintering paste,
and also includes
a third joining layer for joining the power semiconductor element and the spacer by using a sintering paste, and
a sealing material layer in which in a region between the first heat dissipation structure and the second heat dissipation structure, a region where the power semiconductor element, the spacer, and the first to third joining layers are not provided is sealed with a mold sealing material.

7. The power module according to claim 6,
wherein the second heat dissipation structure further includes a second heat dissipation sheet provided for joining a second heat dissipation member to the other surface of the second metal circuit board.

8. The power module according to claim 7,
wherein the second heat dissipation structure further includes the second heat dissipation member joined to the other surface of the second metal circuit board by using the second heat dissipation sheet.

9. The power module according to claim 6,
wherein a ratio R1/R2 between a first thermal resistance R1 in the direction of lamination from a center in a thickness direction of the spacer to the first heat dissipation structure, and a second thermal resistance R2 in the direction of lamination from the center in the thickness direction of the spacer to the second heat dissipation structure, is equal to or more than 0.7 and equal to or less than 1.3.

10. The power module according to claim 9,
wherein the first thermal resistance R1 and the second thermal resistance R2 are equal to or more than 0.05 (K/W) and equal to or less than 0.5 (K/W).

11. The power module according to claim 1,
wherein metal particles contained in the sintering paste are any of silver particles, aluminum particles, or copper particles.

12. The power module according to claim 1,
further comprising a sealing material covering the power semiconductor element.

13. The power module according to claim 12,
wherein the sealing material is formed of a molding resin.

14. The power module according to claim 12,
wherein the sealing material covers and seals the power semiconductor element so as to cover a portion or the entirety of side surfaces in the thickness direction of the first heat dissipation member and/or the second heat dissipation member.

15. The power module according to claim 1, wherein the first metal circuit board and/or the second metal circuit board is a circuit board obtained by patterning thick copper (rolled copper) and has a thickness of equal to or more than 0.3 mm and equal to or less than 5 mm.

* * * * *